US012610643B2

(12) United States Patent
Ahn et al.

(10) Patent No.: US 12,610,643 B2
(45) Date of Patent: Apr. 21, 2026

(54) IMAGE SENSORS INCLUDING META-STRUCTURE FOR COLOR SEPARATION AND ELECTRONIC DEVICES INCLUDING IMAGE SENSOR

(71) Applicants: SAMSUNG ELECTRONICS CO., LTD., Suwon-si (KR); THE BOARD OF TRUSTEES OF THE LELAND STANFORD JUNIOR UNIVERSITY, Stanford, CA (US)

(72) Inventors: Sungmo Ahn, Suwon-si (KR); Sangeun Mun, Suwon-si (KR); Shanhui Fan, Stanford, CA (US); Peter Bert Catrysse, Stanford, CA (US); Hongkyu Park, Suwon-si (KR); Minwoo Lim, Suwon-si (KR); Choonlae Cho, Suwon-si (KR)

(73) Assignees: SAMSUNG ELECTRONICS CO., LTD., Suwon-si (KR); The Board of Trustees of the Leland Stanford Junior University of Office of the General Counsel, Stanford, CA (US)

( * ) Notice: Subject to any disclaimer, the term of this patent is extended or adjusted under 35 U.S.C. 154(b) by 395 days.

(21) Appl. No.: 18/142,219

(22) Filed: May 2, 2023

(65) Prior Publication Data

US 2023/0352506 A1 Nov. 2, 2023

Related U.S. Application Data

(60) Provisional application No. 63/337,421, filed on May 2, 2022.

(30) Foreign Application Priority Data

Mar. 13, 2023 (KR) ........................ 10-2023-0032813

(51) Int. Cl.

| | |
|---|---|
| *H10F 39/00* | (2025.01) |
| *H04N 25/10* | (2023.01) |
| *H10F 39/18* | (2025.01) |

(52) U.S. Cl.

CPC ......... *H10F 39/8063* (2025.01); *H04N 25/10* (2023.01); *H10F 39/182* (2025.01)

(58) Field of Classification Search

CPC .... H10F 39/8063; H10F 39/182; H04N 25/10

(Continued)

(56) References Cited

U.S. PATENT DOCUMENTS

2019/0173191 A1 6/2019 Kamali et al.
2020/0266230 A1 * 8/2020 Miyata ................ H10F 39/8067
2021/0118938 A1 4/2021 Roberts et al.

FOREIGN PATENT DOCUMENTS

CN 112326031 A 2/2021

OTHER PUBLICATIONS

Wei Ting Chen et al., "Flat optics with dispersion-engineered metasurfaces", Nature Reviews Materials, vol. 5, Jun. 19, 2020, pp. 604-520, DOI: 10.1038/s41578-020-0203-3.

(Continued)

*Primary Examiner* — Joel W Fosselman
(74) *Attorney, Agent, or Firm* — Sughrue Mion, PLLC

(57) ABSTRACT

The present disclosure provides meta-optical elements and image sensors using a meta-pattern and apparatuses including the image sensors. In an embodiment, an image sensor includes a plurality of pixels. Each pixel of the plurality of pixels includes a photoelectric conversion layer including at least one photoelectric conversion element, and a color routing meta-structure layer provided at a position facing the photoelectric conversion layer. The color routing meta-structure layer includes a meta-structure having a symmetrical structure with respect to a center of a corresponding (Continued)

pixel, and a multi-layer structure having a refractive index that varies in a direction perpendicular to a light-incident surface.

18 Claims, 35 Drawing Sheets

(58) Field of Classification Search
USPC .......................................................... 348/280
See application file for complete search history.

(56) References Cited

OTHER PUBLICATIONS

Ehsan Arbabi et al., “Full Stokes imaging polarimetry using dielectric metasurfaces”, Mar. 9, 2018, 20 pages, arXiv:1803.03384v1 [physics.optics].

* cited by examiner (a) (b)

(a)

(b)

(a) (b)

IMAGE SENSORS INCLUDING META-STRUCTURE FOR COLOR SEPARATION AND ELECTRONIC DEVICES INCLUDING IMAGE SENSOR

CROSS-REFERENCE TO RELATED APPLICATIONS

This application claims benefit of priority under 35 U.S.C. § 119 to Korean Patent Application No. 10-2023-0032813, filed on Mar. 13, 2023, in the Korean Intellectual Property Office, and to U.S. Provisional Patent Application No. 63/337,421, filed on May 2, 2022, in the U.S. Patent and Trademark Office, the disclosures of which are incorporated by reference herein in their entireties.

BACKGROUND

1. Field

The present disclosure relates generally to image sensors using a meta-pattern, and more particularly, to image sensors including a color separation meta-structure and electronic devices including the image sensors.

2. Description of Related Art

Meta-optics may refer to a field of optical technology that may implement new optical characteristics that may not be realized with existing materials, for example, by using nanostructures having a scale smaller than the wavelength of light.

An image sensor may refer to a semiconductor optical element that may receive light by position and color from an image formed by a lens and/or may convert the light into an electrical signal.

In a related image sensor, micro-lenses and/or color filters may be integrated for each pixel of the related image sensor. As pixels may gradually become ultra-fine, for example, according to a demand for high-resolution cameras, the size of micro-lenses and/or color filters may gradually reduce, resulting in a potentially lower light efficiency.

Thus, there exists a need for high-efficiency color separation meta-structures applicable to image sensors based on meta-optics, as the need for reduced-size pixels may be constrained by lower light efficiency. Improvements are presented herein. These improvements may also be applicable to other image sensing technologies.

SUMMARY

One or more example embodiments of the present disclosure may provide meta-optical devices that may not be affected by polarization characteristics of incident light while providing a desired light efficiency.

One or more example embodiments of the present disclosure may provide image sensors including the meta-optical devices.

One or more example embodiments of the present disclosure may provide electronic devices including the image sensors.

According to an aspect of the present disclosure, an image sensor is provided. The image sensor includes a plurality of pixels. Each pixel of the plurality of pixels includes a photoelectric conversion layer including at least one photoelectric conversion element, and a color routing meta-structure layer provided at a position facing the photoelectric conversion layer. The color routing meta-structure layer includes a meta-structure having a symmetrical structure with respect to a center of a corresponding pixel, and a multi-layer structure having a refractive index that varies in a direction perpendicular to a light-incident surface.

In some embodiments, the photoelectric conversion layer may include one photoelectric conversion element.

In some embodiments, each pixel of the plurality of pixels may include at least one of a red (R) pixel, a green (G) pixel, and a blue (B) pixel, and the photoelectric conversion layer may include four photoelectric conversion elements arranged in a 2×2 pattern.

In some embodiments, the color routing meta-structure layer may include four sub-color routing meta-structure layers corresponding to the four photoelectric conversion elements, and each layer of the four sub-color routing meta-structure layers may include a meta-structure including a distinct symmetrical structure.

In some embodiments, each layer of the multi-layer structure may include a distinct meta-structure including a distinct symmetrical structure.

In some embodiments, the color routing meta-structure layer may include a plurality of color routing meta-structure layers that are sequentially stacked. A first color routing meta-structure layer of the plurality of color routing meta-structure layers may include a first meta-structure formed as a first symmetrical structure. A second color routing meta-structure layer of the plurality of color routing meta-structure layers may include a second meta-structure formed as a second symmetrical structure. A third color routing meta-structure layer of the plurality of color routing meta-structure layers may include a third meta-structure formed as a third symmetrical structure. A fourth color routing meta-structure layer of the plurality of color routing meta-structure layers may include a fourth meta-structure formed as a fourth symmetrical structure. A fifth color routing meta-structure layer of the plurality of color routing meta-structure layers may include a fifth meta-structure formed as a fifth symmetrical structure. A first shape of the first meta-structure, a second shape of the second meta-structure, a third shape of the third meta-structure, a fourth shape of the fourth meta-structure, and a fifth shape of the fifth meta-structure may be different from each other.

In some embodiments, the plurality of pixels may include an R pixel configured to receive red light, a first G pixel configured to receive green light, a second G pixel configured to receive green light, and a B pixel configured to receive blue light. A first meta-structure may be included by a first color routing meta-structure layer of the R pixel. A second meta-structure may be included by a second color routing meta-structure layer of the first G pixel. A third meta-structure may be included by a third color routing meta-structure layer of the second G pixel. A fourth meta-structure may be included by a fourth color routing meta-structure layer of the B pixel. The first meta-structure, the second meta-structure, the third meta-structure, and the fourth meta-structure may be different from each other.

In some embodiments, the R pixel, the first G pixel, the second G pixel, and the B pixel may be aligned to form a Bayer pattern. In such embodiments, the second meta-structure and the third meta-structure may include mutually symmetric meta-structures.

In some embodiments, the R pixel, the first G pixel, the second G pixel and the B pixel may be aligned to form a Bayer pattern. In such embodiments, the second meta-structure and the third meta-structure may be different from each other.

In some embodiments, a spacer may be provided between the photoelectric conversion layer and the color routing meta-structure layer.

According to an aspect of the present disclosure, a meta-optical element is provided. The meta-optical element includes an area corresponding to a pixel of an image sensor. The area includes a multi-layer structure in which a refractive index varies in a direction perpendicular to a light-incident surface. The area further includes a meta-structure formed as a symmetrical structure.

In some embodiments, the image sensor may include an R pixel configured to receive red light, a first G pixel configured to receive green light, a second G pixel configured to receive green light, and a B pixel configured to receive blue light. The area may include a first area corresponding to the R pixel, a second area corresponding to the first G pixel, a third area corresponding to the second G pixel, fourth area corresponding to the B pixel. The first area may include a first meta-structure formed as a first symmetrical structure. The second area may include a second meta-structure formed as a second symmetrical structure. The third area may include a third meta-structure formed as a third symmetrical structure. The fourth area may include a fourth meta-structure formed as a fourth symmetrical structure. The first meta-structure, the second meta-structure, the third meta-structure, and the fourth meta-structure may be different from each other.

In some embodiments, the R pixel, the first G pixel, the second G pixel, and one B pixel may be aligned to form a Bayer pattern. In such embodiments, the second meta-structure and the third meta-structure may be symmetric to each other.

In some embodiments, the R pixel, the first G pixel, the second G pixel, and the B pixel may be aligned to form a Bayer pattern. In such embodiments, the second meta-structure and the third meta-structure may be different from each other.

In some embodiments, the pixel may include at least one of an R pixel, a G pixel, and a B pixel. In such embodiments, the pixel may include four photoelectric conversion elements, the area may include four areas corresponding to the four photoelectric conversion elements, and each area of the four areas may include a symmetrically formed meta-structure.

In some embodiments, the pixel may include at least one of an R pixel, a G pixel, and a B pixel. In such embodiments, the pixel may include four photoelectric conversion elements.

In some embodiments, the multi-layer structure may include a plurality of layers that may be sequentially stacked. In such embodiments, each layer of the plurality of layers may include a symmetrically formed meta-structure, and meta-structures of two adjacent layers of the plurality of layers may be different from each other.

According to an aspect of the present disclosure, an electronic device is provided. The electronic device includes at least one image sensor, a processor configured to control the least one image sensor to capture an image, and a display configured to display information that is acquired from the image. The at least one image sensor includes a plurality of pixels. Each pixel of the plurality of pixels includes a photoelectric conversion layer including at least one photoelectric conversion element, and a color routing meta-structure layer provided at a position facing the photoelectric conversion layer. The color routing meta-structure layer includes a meta-structure having a symmetrical structure with respect to a center of a corresponding pixel, and a multi-layer structure having a refractive index that varies in a direction perpendicular to a light-incident surface.

In some embodiments, the plurality of pixels may include an R pixel configured to receive red light, a first G pixel configured to receive green light, a second G pixel configured to receive green light, and a B pixel configured to receive blue light. In such embodiments, a first meta-structure may be included by a first color routing meta-structure layer of the R pixel, a second meta-structure may be included by a second color routing meta-structure layer of the first G pixel, a third meta-structure may be included by a third color routing meta-structure layer of the second G pixel, and a fourth meta-structure may be included by a fourth color routing meta-structure layer of the B pixel. The first meta-structure, the second meta-structure, the third meta-structure, and the fourth meta-structure may be different from each other.

In some embodiments, the R pixel, the first G pixel, the second G pixel, and the B pixel may be aligned to form a Bayer pattern. In such embodiments, the second meta-structure and the third meta-structure may include mutually symmetric meta-structures.

According to another aspect of the present disclosure, an image sensor may include: a pixel layer that comprises a red pixel, a blue pixel, two green pixels that are arranged in a two-by-two matrix form; and a color routing meta-structure layer that includes: symmetrical meta-structures which are provided directly above the two green pixels and are arranged in a diagonal direction; and meta-structures that have random and asymmetrical structures from each other, and are provided in a remaining area of the color routing meta-structure layer. The color routing meta-structure layer includes a multi-layer structure having a refractive index that varies in a direction perpendicular to a light-incident surface.

Additional aspects are set forth in part in the description which follows and, in part, may be apparent from the description, and/or may be learned by practice of the presented embodiments.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
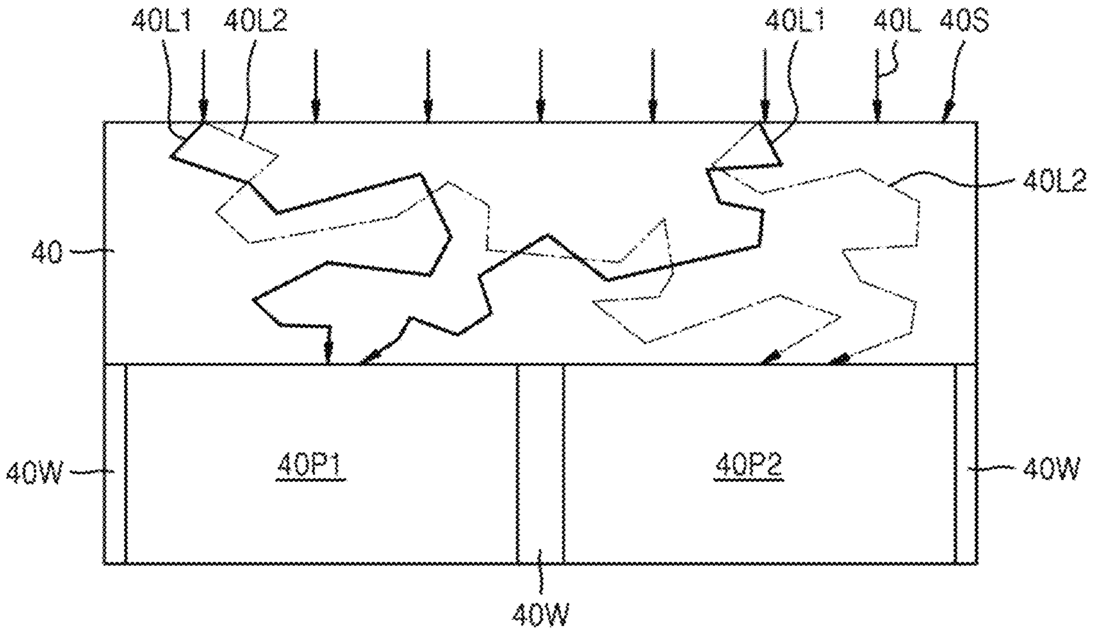
FIG. 1 is a cross-sectional view conceptually illustrating a process in which light incident on a color routing meta-structure layer may be separated by color (e.g., wavelength) and the separated light may be collected by color, according to an example embodiment.

Hereinafter, a meta-optical element (e.g., a color routing meta-structure), according to an example embodiment, an image sensor including the same, and an electronic device including the image sensor are described in detail with reference to the accompanying drawings. The meta-optical element may be described along with the description of the image sensor. The meta-optical element may be referred to as a meta-optical device. In the following description, the thickness of layers and/or areas shown in the drawings may be slightly exaggerated for clarity of the specification. In addition, the embodiments described below are merely illustrative, and various modifications may be possible from these embodiments. Furthermore, in the layer structure described below, the expressions described as "upper part" or "upper part" may include not only what is directly on top of but also what is on top of non-contact. In the description below, like reference numerals in each drawing may denote like members.

It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element)

is referred to, with or without the term "operatively" or "communicatively", as "coupled with," "coupled to," "connected with," or "connected to" another element (e.g., a second element), it means that the element may be coupled with the other element directly (e.g., wired), wirelessly, or via a third element.

Reference throughout the present disclosure to "one embodiment," "an embodiment," "an example embodiment," or similar language may indicate that a particular feature, structure, or characteristic described in connection with the indicated embodiment is included in at least one embodiment of the present solution. Thus, the phrases "in one embodiment", "in an embodiment," "in an example embodiment," and similar language throughout this disclosure may, but do not necessarily, all refer to the same embodiment.

As used herein, each of the terms "$SiO_2$", "$Si_3N_4$", "$Al_2O_3$", "$TiO_2$", and the like may refer to a material made of elements included in each of the terms and is not a chemical formula representing a stoichiometric relationship.

Recently, research results on a high-efficiency color separation meta-structure applicable to image sensors based on meta-optics may have been reported. Such color separation meta-structures may be located on top of a pixel in an image sensor. Light incident to such a color separation meta-structure may be separated and/or collected without loss by color (e.g., by wavelength) while passing through the color separation meta-structure.

The color separation meta-structure may have a form of a nanostructure with a scale smaller than the wavelength of the incident light. The color separation meta-structure may have a shape not only on the plane where the image sensor pixels are placed but also in the direction in which light travels, resulting in a three-dimensional nanostructure.

The design of such a color separation meta-structure may be performed by repeatedly optimizing the meta-structure for an objective function such as, but not limited to, light efficiency. For example, in a color separation meta-structure for an image sensor, an objective function may be set and the color separation meta-structure may be optimized so that light efficiency for a wavelength corresponding to each pixel may be increased. However, in such an optimized color separation meta-structure, optical properties other than light efficiency may be degraded in an undesirable direction.

FIG. 1 is a cross-sectional view conceptually illustrating a process of color separation and gathering of separated colors occurring in a color routing meta-structure layer applied to an image sensor, according to an example embodiment. A color routing meta-structure layer may be described through the description of FIG. 1.

Referring to FIG. 1, while traveling into the color routing meta-structure layer 40, the light 40L incident on the color routing meta-structure layer 40 may be color-separated by the meta-pattern formed on the color-routing meta-structure layer 40 and directed to the pixels (e.g., first pixel 40P1, second pixel 40P2) corresponding to the separated colors. Consequently, the color routing meta-structure layer 40 may be referred to as a meta-structure layer that may serve as a lens that collects light by color while separating the colors.

In an embodiment, the incident light 40L incident on the color routing meta-structure layer 40 may include a first light 40L1 having a first wavelength, and a second light 40L2 having a second wavelength that may be different from the first wavelength. For example, the first light 40L1 may be and/or include at least one of red light, green light, and blue light. For another example, the second light 40L2 may be and/or include another one of red light, green light, and blue light. For yet another example, the incident light 40L may further include a third light having a third wavelength different from the first and second wavelengths of first and second lights 40L1 and 40L2. In an embodiment, the third light may propagate along a path different from the paths of the first and second lights 40L1 and 40L2.

A process in which the first light 40L1 propagates into the color routing meta-structure layer 40 at various places of the light incident surface 40S of the color routing meta-structure layer 40 is described below.

In an embodiment, the first light 40L1 may propagate within the color routing meta-structure layer 40 by being scattered by a meta-pattern existing inside the color routing meta-structure layer 40. Alternatively or additionally, the first light 40L1 may be incident to the first pixel 40P1 according to a phase change by the meta-pattern. That is, while the departure positions of the first light 40L1 at which the first light 40L1 is incident on the light incident surface 40S may be different, the light 40L1 may be incident to the first pixel 40P1 due to the meta-pattern inside the color routing meta-structure layer 40.

As a result, since light of the first wavelength is incident (e.g., condensed) to the first pixel 40P1 from an area larger than the first pixel 40P1, light efficiency may be improved when compared to related technology.

In an embodiment, the first pixel 40P1 may be and/or may include a photoelectric conversion element configured to receive at least one of red light, green light, and blue light. In an optional or additional embodiment, a partition wall 40W may be arranged between the first and second pixels 40P1 and 40P2 in order to prevent light current leakage.

The principle of propagation of the second light 40L2 in the color routing meta-structure layer 40 may be substantially the same as the principle of propagation of the first light 40L1 as described above. However, since the second light 40L2 has a different wavelength from the first light 40L1, the second light 40L2 may be incident on the second pixel 40P2, even if the second light 40L2 departs from a same position as the first light 40L1. For example, when the first pixel 40P1 includes a first photoelectric conversion element configured to receive red light, the second pixel 40P2 may be and/or include a second photoelectric conversion element configured to receive at least one of green light and blue light.

For another example, when the third light is incident at the same position as the first and second lights 40L1 and 40L2, the third light may be incident to a third pixel different from the first and second pixels 40P1 and 40P2, since the third light has a different wavelength from the first light and second lights 40L1 and 40L2. Alternatively or additionally, the third pixel may be and/or include a photoelectric conversion element configured to receive the other one of green light and blue light.

As shown in FIG. 1, the light 40L incident on the color routing meta-structure layer 40 may travel in a depth direction from the incident surface 40S, a travel (e.g., propagation) path of the incident light 40L may be changed according to a component (e.g., wavelength) of the incident light 40L. Consequently, substantially similar and/or identical light components of the light 40L may converge to one place and/or the same pixel. The term "substantially similar light components" may indicate light components that belong to a same color and/or wavelength band such as, but not limited to, a red band, a green band or a blue band.

In an embodiment, the color routing meta-structure layer 40 may include different meta-patterns for each thickness position and/or layer. That is, as the incident light 40L propagates from the incident surface 40S of the color routing meta-structure layer 40 (e.g., the upper surface) to the lower surface of the color routing meta-structure layer 40 (e.g., the first and second pixels 40P1 and 40P2), the meta-pattern inside the color routing meta-structure layer 40 may vary. For example, the color routing meta-structure layer 40 may be manufactured to obtain the above result by forming different types of meta-patterns according to the depth of the color routing meta-structure layer 40. An example of the layer structure of the color routing meta-structure layer 40 is described with reference to FIGS. 14 to 17.

Figure 2:
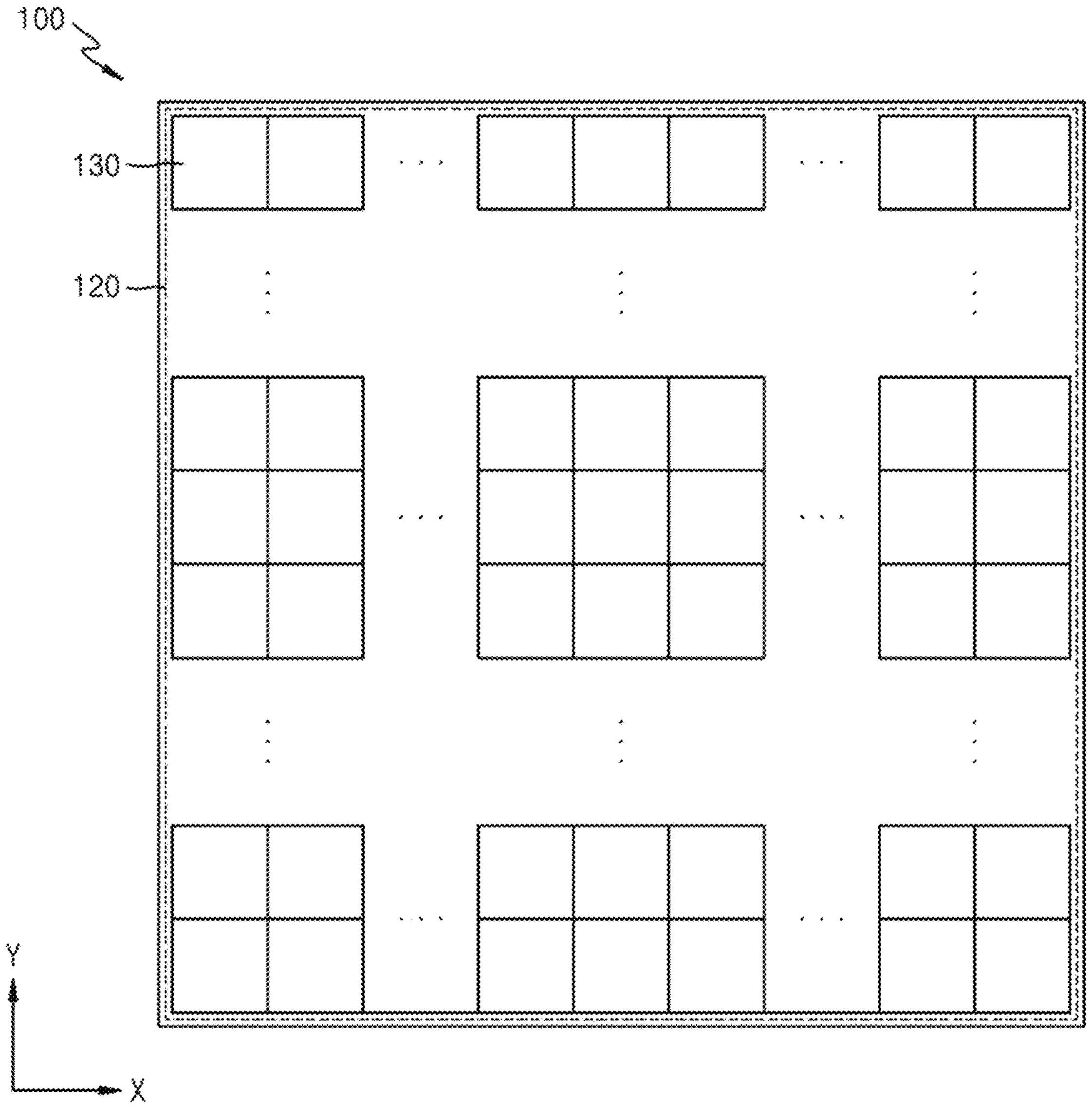
FIG. 2 is a plan view illustrating an image sensor including a color separation meta-structure, according to an example embodiment.

FIG. 2 is a plan view illustrating an image sensor including a color routing meta-structure layer, according to an example embodiment.

Referring to FIG. 2, an image sensor 100 may include a color routing meta-structure layer that includes a pixel array 120. The pixel array 120 may include a plurality of unit pixels 130 aligned in a first direction and a second direction. The first and second directions may be perpendicular to each other. For example, the first direction may be a direction parallel to the X axis. For another example, the second direction may be a direction parallel to the Y-axis. That is, the first direction may be referred to as a horizontal direction and the second direction may be referred to as a vertical direction. However, the present disclosure is not limited in this regard. For example, the first direction may be referred to as a vertical direction and the second direction may be referred to in a horizontal direction without departing from the scope of the present disclosure.

Figure 3:
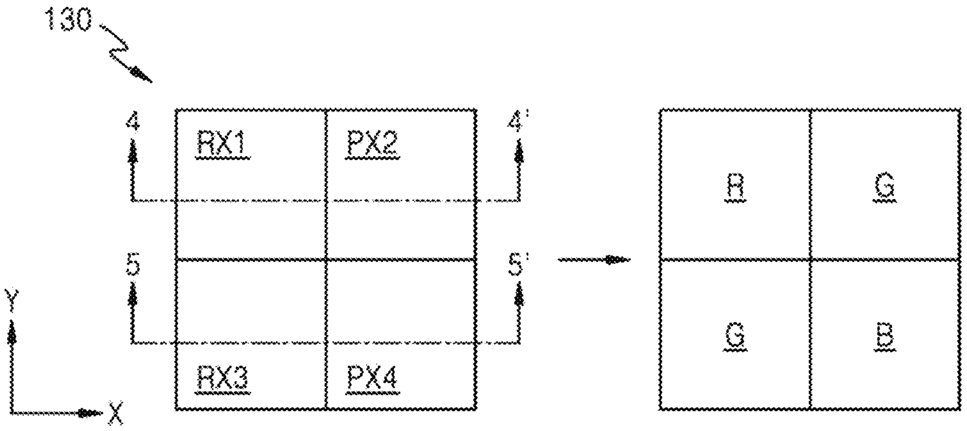
FIG. 3 is an enlarged plan view of a unit pixel of FIG. 2, according to an example embodiment.

FIG. 3 illustrates an enlarged plan view of a unit pixel 130 of FIG. 2, according to an embodiment.

For example, the unit pixel 130 may include four pixels (e.g., first pixel PX1, second pixel PX2, third pixel PX3, and fourth pixel PX4) arranged in 2 rows and 2 columns (e.g., 2×2), as shown in FIG. 3.

In an embodiment, the first to fourth pixels PX1 to PX4 may be aligned to form a Bayer pattern. However, the present disclosure is not limited in this regard. That is, the first to fourth pixels PX1 to PX4 may be arranged in other patterns without deviating from the scope of the present disclosure. For example, the first pixel PX1 may be a red (R) pixel configured to receive red light, the second and third pixels PX2 and PX3 may be green (G) pixels configured to receive green light, and the fourth pixel PX4 may be a blue (B) pixel configured to receive blue light.

For another example, at least one of the first to fourth pixels PX1 to PX4 may be and/or include an infrared (IR) pixel configured to receive infrared rays. Alternatively or additionally, at least one of the first to fourth pixels PX1 to PX4 may be and/or include a white (W) pixel configured to receive white light. For another example, the first to fourth pixels PX1 to PX4 may be configured to receive at least one of cyan light, magenta light, and yellow light.

Figure 4:
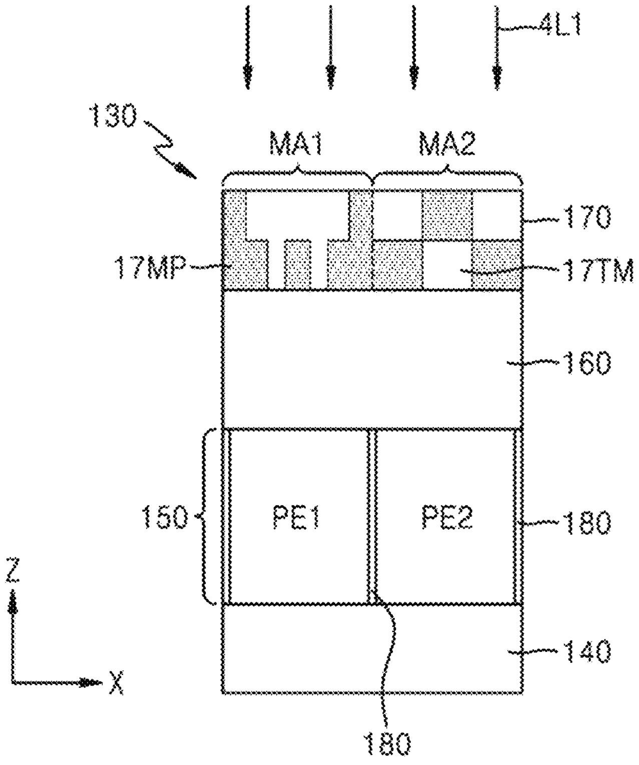
FIG. 4 is a cross-sectional view of FIG. 3 taken in the 4-4' direction, according to an example embodiment.
Figure 5:
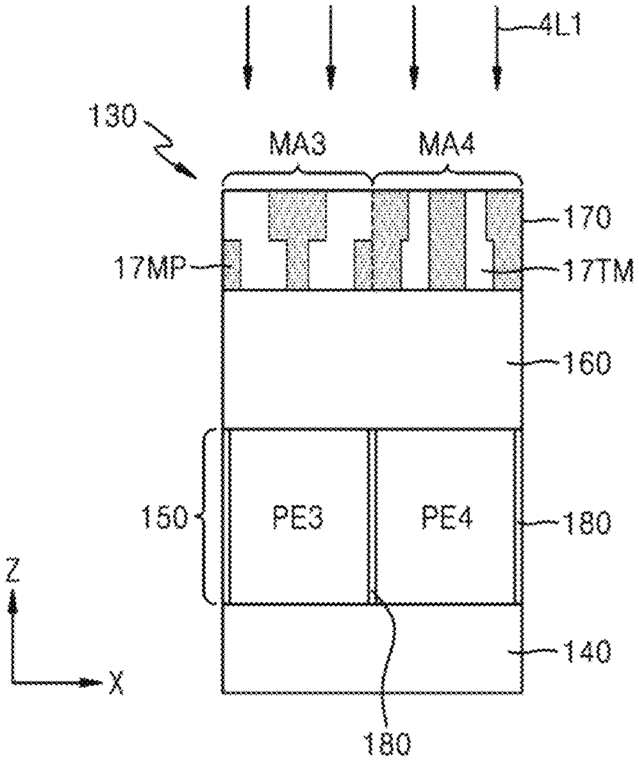
FIG. 5 is a cross-sectional view of FIG. 3 taken in a 5-5' direction, according to an example embodiment.

FIG. 4 is a cross-sectional view of FIG. 3 taken in a 4-4' direction, according to an embodiment. FIG. 5 is a cross-sectional view of FIG. 3 taken in a 5-5' direction, according to an embodiment.

Referring to FIGS. 4 and 5 together, the unit pixel 130 may include a substrate 140, a photoelectric conversion layer 150 provided on the substrate 140, an intermediate layer 160 formed on the photoelectric conversion layer 150, and a color routing meta-structure layer 170 provided on the intermediate layer 160.

In an embodiment, the substrate 140, the photoelectric conversion layer 150, the intermediate layer 160, and the color routing meta-structure layer 170 may be sequentially stacked. However, other material layers may be further formed between each layer.

The substrate 140 may include a circuit and/or a circuit unit for driving and controlling a photoelectric conversion element included in the photoelectric conversion layer 150. In an embodiment, the circuit may include a readout integrated circuit (ROIC). The intermediate layer 160 may be and/or include a material layer that may be transparent to incident light. Alternatively or additionally, the intermediate layer 160 may be and/or include one of the members that provide a spatial distance through which light separated by the color routing meta-structure layer 170 may reach the photoelectric conversion layer 150. That is, the intermediate layer 160 may be referred to as a spacer. For example, a material constituting the intermediate layer 160 may include, but not be limited to, silicon oxide ($SiO_2$), and the like. In an optional or additional embodiment, the intermediate layer 160 may be omitted between the photoelectric conversion layer 150 and the color routing meta-structure layer 170, as described with reference to FIGS. 6 and 7.

Figure 6:
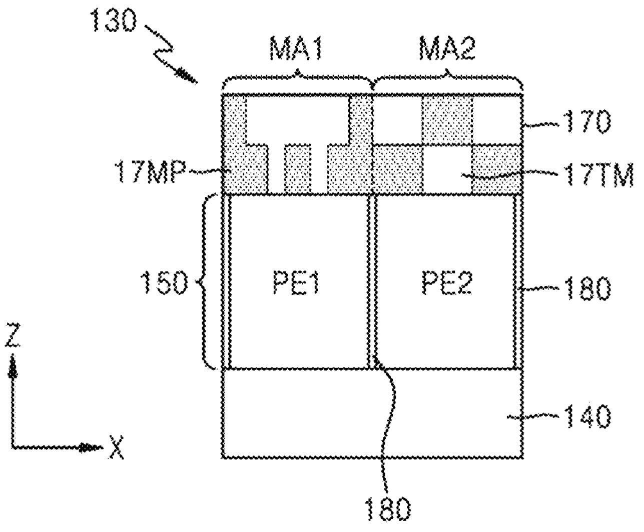
FIG. 6 is a cross-sectional view illustrating a case in which an intermediate layer is omitted in FIG. 4, according to an example embodiment.
Figure 7:
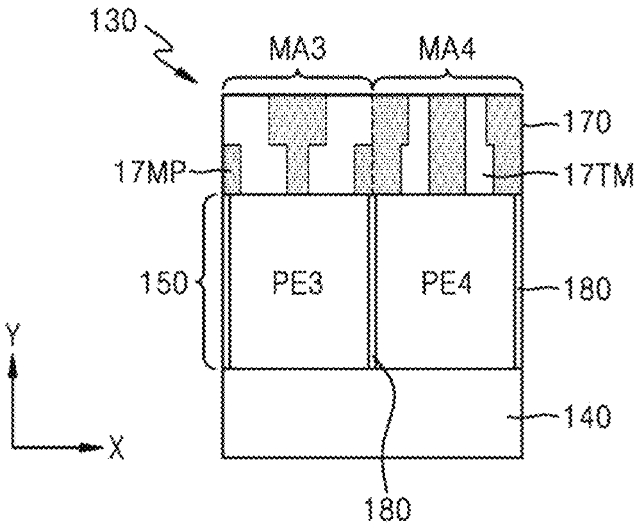
FIG. 7 is a cross-sectional view illustrating a case in which an intermediate layer is omitted in FIG. 5, according to an example embodiment.

In an embodiment, as shown in FIGS. 6 and 7, the photoelectric conversion layer 150 and the color routing meta-structure layer 170 may directly contact each other.

Referring to FIGS. 4 to 7, the photoelectric conversion layer 150 may include photoelectric conversion elements (e.g., first photoelectric conversion element PE1, second photoelectric conversion element PE2, third photoelectric conversion element PE3, and fourth photoelectric conversion element PE4), and a partition wall 180. In an embodiment the partition wall 180 may be disposed between each of the first to fourth photoelectric conversion elements PE1 to PE4 to prevent optical interference. For example, the partition wall 180 may have a structure (e.g., p-deep trench isolation (DTI)) that partially forms a trench between the first to fourth photoelectric conversion elements PE1 to PE4. That is, the partition wall 180 may include a structure including a trench formed between the first to fourth photoelectric conversion elements PE1 to PE4 to a depth smaller than the thickness of the photoelectric conversion layer 150. In an embodiment, the partition wall 180 may have a structure (e.g., full-depth DTI (f-DTI)) forming a trench as a whole between the first to fourth photoelectric conversion elements PE1 to PE4. That is, the partition wall 180 may have a structure including a trench formed between the first to fourth photoelectric conversion elements PE1 to PE4 to have a thickness that is substantially similar or the same thickness as the photoelectric conversion layer 150. In an optional or additional embodiment, the first to fourth photoelectric conversion elements PE1 to PE4 may be and/or include photodiodes. However, the present disclosure is not limited in this regard.

The first photoelectric conversion element PE1 may belong (e.g., correspond) to the first pixel PX1, the second photoelectric conversion element PE2 may belong to the second pixel PX2, the third photoelectric conversion element PE3 may belong to the third pixel PX3, and the fourth photoelectric conversion element PE4 may belong to the fourth pixel PX4, respectively.

In an embodiment, the color routing meta-structure layer 170 may have a multi-layer structure, as described with reference to FIGS. 13 to 18.

In an embodiment, the color routing meta-structure layer 170 may include meta-pattern areas (e.g., first meta-pattern area MA1, second meta-pattern area MA2, third meta-pattern area MA3, and fourth meta-pattern area MA4).

The first meta-pattern area MA1 may be an area belonging to the first pixel PX1 and may correspond to the first photoelectric conversion element PE1. The second meta-pattern area MA2 may be an area belonging to the second pixel PX2 and may correspond to the second photoelectric conversion element PE2. The third meta-pattern area MA3 may be an area belonging to the third pixel PX3 and may correspond to the third photoelectric conversion element PE3. The fourth meta-pattern area MA4 may be an area belonging to the fourth pixel PX4 and may correspond to the fourth photoelectric conversion element PE4.

Each of the first to fourth meta-pattern areas MA1 to MA4 may include a plurality of meta-patterns 17MP including a material having a first refractive index and a transparent material layer 17TM having a second refractive index. The magnitude of the first refractive index may be different from the magnitude of the second refractive index. For example, the first refractive index may be greater than the second refractive index. In an embodiment, the transparent material layer 17TM may be and/or include a material that may be transparent to incident light and/or a material having a lower refractive index than the refractive index of the plurality of meta-patterns 17MP. For example, the transparent material layer 17TM may include, but not be limited to, silicon oxide ($SiO_2$), siloxane-based spin on glass (SOG), silicon nitride ($Si_3N_4$), aluminum oxide ($Al_2O_3$), air, and the like.

Each meta-pattern 17MP may be and/or include a pattern having a size smaller than the wavelength of light incident on the unit pixel 130. That is, the pattern may be and/or include a nanostructure having a height (e.g., thickness), width, and/or diameter smaller than the wavelength of incident light. For example, the height, width and/or diameter of the nanostructure may be in the range of several nanometers (nm) to hundreds of nanometers. In an embodiment, each meta-pattern 17MP may be and/or include a nano-post and/or a pattern having a similar shape. However, the present disclosure is not limited in this regard.

For example, the widths and/or diameters of the plurality of meta-patterns 17MP in the color routing meta-structure layer 170 and/or in each meta-pattern area MA1 to MA4 may be substantially similar and/or be the same and/or different from each other. That is, some meta-patterns may have a substantially similar and/or the same width and/or diameter. Alternatively or additionally, other meta-patterns may have different widths and/or diameters.

The three-dimensional shape, width, or diameter of each meta-pattern 17MP may be constant and/or change in a direction perpendicular to the photoelectric conversion layer 150 (e.g., Z-axis direction), according to example embodiments. For example, when the shape of each meta-pattern 17MP is a nano post, the nano-post may be a three-dimensional structure in which the diameter of the post may be constant in the vertical direction and/or a three-dimensional structure in which the refractive index changes in the vertical direction.

When the meta-patterns of each layer of the color routing meta-structure layer 170 are different, the refractive indices of each layer may be different, and incident light may be separated by color (e.g., by wavelength) due to this difference. For example, when the shape of each meta-pattern 17MP is a nano-post, the nano-post may have a three-dimensional structure in which the thickness of the first section and the thickness of the second section between the lower end and the upper end are different from each other. That is, the second section may be one of sections of the nano-post that may be different from the first section, and/or may be different from the rest of the nano-post except for the first section. For another example, the nano-post may have a three-dimensional structure in which a thickness and/or a width continuously changes in the vertical direction. That is, when the three-dimensional shape of each meta-pattern 17MP is a nano-post, the nano-post may have a three-dimensional structure in which a diameter gradually decreases and/or increases from the bottom to the top and/or from the top to the bottom. Accordingly, the refractive index of the color routing meta-structure layer 170 may vary in the vertical direction from the first position of the horizontal direction (e.g., X-axis direction) according to the provided shape of the meta-pattern 17MP in each of the meta-pattern areas MA1 to MA4. For example, the first position may be an arbitrary position within each of the meta-pattern areas MA1 to MA4. For another example, the refractive index in the vertical direction at a certain position of the horizontal direction of each of the meta-pattern area MA1 to MA4 may not change and/or may not substantially change.

The refractive index characteristic of the color routing meta-structure layer 170 may be applied even when the color routing meta-structure layer 170 has a multi-layer structure, as described with reference to FIG. 17.

In an embodiment, the plurality of meta-patterns 17MP in each meta-pattern area MA1 to MA4 may be formed to form a meta-structure having symmetry on a plane. That is, each of the meta-pattern areas MA1 to MA4 on a plane may include a meta-structure having symmetry, which may be implemented by combining a plurality of meta-patterns 17MP. Consequently, each of the meta-pattern areas MA1 to MA4 may be referred to as a meta-structure area and/or as a three-dimensional meta-surface.

The meta-structure between each of the meta-pattern area MA1 to MA4 may be different. For example, the meta-structures of the first to fourth meta-pattern areas MA1 to MA4 may be different from each other. However, the present disclosure is not limited in this regard.

As used herein, symmetry may refer to the plurality of meta-patterns 17MP being formed to achieve left-right symmetry, up-down symmetry, diagonal symmetry, and/or rotational symmetry based on the center of the pixel PX1 including the first meta-pattern area MA1 on the plane and/or a line passing through the center. As FIGS. 4 and 5 illustrate cross-sections, only left-right symmetry of the first meta-pattern area MA1 may be seen in FIGS. 4 and 5. The symmetry of the first meta-pattern area MA1 may be equally applied to other meta-pattern areas such as second to fourth meta-pattern areas MA2 to MA4.

Figure 8:
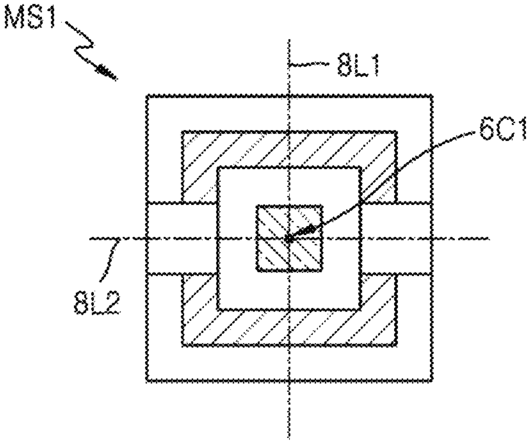
FIG. 8 is a plan view exemplarily illustrating a first meta-structure formed in a first meta-pattern area of FIGS. 4 and 5, according to an example embodiment.

FIG. 8 exemplarily shows the first meta-structure MS1 formed in the first meta-pattern area MA1, according to an embodiment.

Referring to FIG. 8, the first meta-structure MS1 may be rotationally symmetric with respect to the center of symmetry 6C1. Alternatively or additionally, the first meta-structure MS1 may have a left-right symmetrical and/or up-down symmetrical structure around the reference lines (e.g., first reference line 8L1 and second reference line 8L2) passing through the center of symmetry 6C1. The center of symmetry 6C1 may correspond to the center of the plane of the pixel PX1 including the first meta-structure MS1.

As the first meta-pattern area MA1 has a three-dimensional meta-structure having symmetry, the light incident on the first meta-pattern area MA1 may be normally color-separated for each wavelength regardless of the polarization state of the incident light. Alternatively or additionally, a spot of vertically incident light may be located at the center of a pixel. In addition, because the first meta-pattern area MA1 has a three-dimensional meta-structure having symmetry, the spot of light may move right or left, and/or up or down from the center of the pixel, depending on the incident direction of light. However, the spot of light may not be divided into a plurality of spots and/or the spot may not be located at several places around the center of the pixel at the same time, even when the light is obliquely incident on the first meta-pattern area MA1. Accordingly, a signal ratio measured at left and right or at top and bottom of the center of a pixel may be increased, and thus, a phase detection autofocus operation may be possible.

In an embodiment, the meta-structure formed in the second to fourth meta-pattern areas MA2 to MA4 may also have a three-dimensional structure having symmetry, and thus, the operation characteristic according to the symmetry of the first meta-pattern area MA1 may be equally applied to the second to fourth meta-pattern areas MA2 to MA4.

The meta-patterns 17MP of each area of the second to fourth meta-pattern areas MA2 to MA4 of FIGS. 4 and 5 may also be provided to form a three-dimensional meta-structure having symmetry on a plane.

Figure 9:
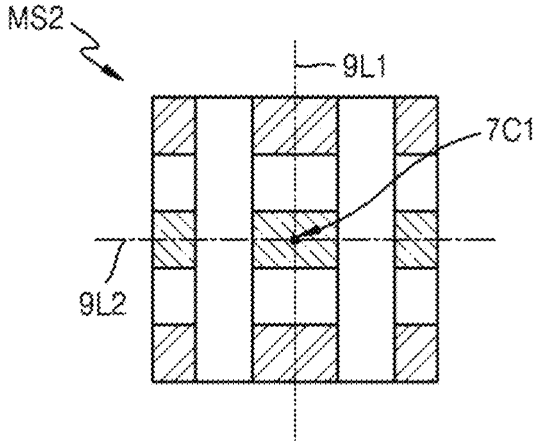
FIG. 9 is a plan view schematically illustrating a planar shape of an exemplary second meta-structure formed in a second meta-pattern area of FIG. 4, according to an example embodiment.
Figure 10:
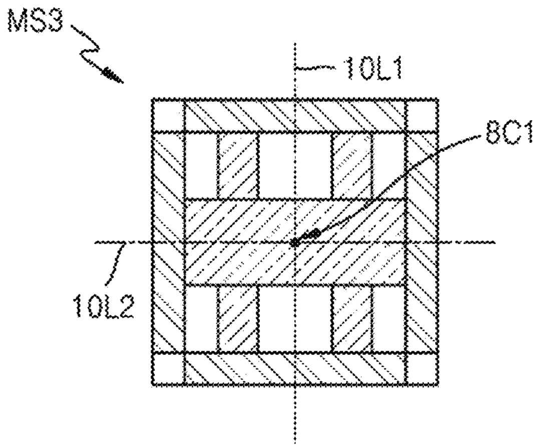
FIG. 10 is a plan view schematically illustrating a planar shape of an exemplary third meta-structure formed in a third meta-pattern area of FIG. 5, according to an example embodiment.
Figure 11:
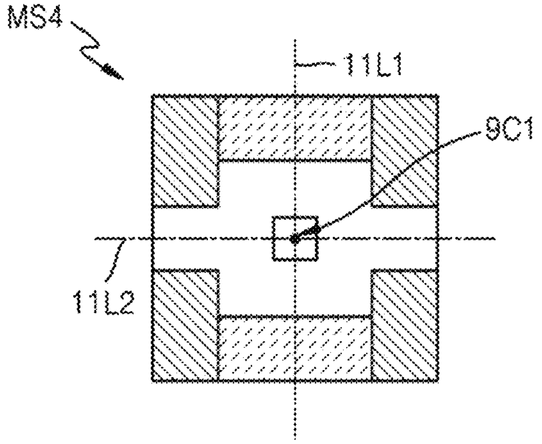
FIG. 11 is a plan view schematically illustrating a planar shape of an exemplary fourth meta-structure formed in a fourth meta-pattern area of FIGS. 4 and 5, according to an example embodiment.

However, as shown in FIGS. 9 to 11, the shape on the plane of the three-dimensional meta-structure of each area of the second to fourth meta-pattern areas MA2 to MA4 may be different from each other, and may also be different from the shape seen on the plane of the three-dimensional meta-structure formed in the first meta-pattern area MA1.

FIG. 9 is a plan view exemplarily illustrating a planar shape of a second meta-structure MS2 formed in a second meta-pattern area MA2, according to an embodiment. FIG. 10 is a plan view exemplarily illustrating a planar shape of a third meta-structure MS3 formed in a third meta-pattern area MA3, according to an embodiment. FIG. 11 is a plan view exemplarily illustrating a planar shape of a fourth meta-structure MS4 formed in a fourth meta-pattern area MA4, according to an embodiment.

Referring to FIGS. 9 to 11, the second to fourth meta-structures MS2 to MS4 formed in the second to fourth meta-pattern areas MA2 to MA4 may have up-down, left-right, and/or rotational symmetry based on respective centers of symmetry (e.g., 7C1, 8C1, and 9C1) and/or centered on a reference line passing through the respective centers of symmetry (e.g., 7C1, 8C1, and 9C1). However, the planar form (e.g., distribution form of a plurality of meta-patterns) of each of the meta-structures MS2, MS3, and MS4 may different from each other. Alternatively or additionally, the planar form of each of the meta-structures MS2, MS3, and MS4 may be different from the planar form of the first meta-structure MS1 of the first meta-pattern area MA1 shown in FIG. 8.

As shown in FIGS. 9 to 11, the second to fourth meta-structures MS2 to MS4 that may be formed in each area of the second to fourth meta-pattern areas MA2 to MA4 may also have symmetry. Accordingly, each of the second to fourth meta-pattern areas MA2, MA3, and MA4 may have the same color separation and auto-focus characteristics as the first meta-pattern area MA1 with respect to incident light, as described above. However, considering that the first meta-pattern area MA1, the second meta-pattern area MA2, and the fourth meta-pattern area MA4 belong to different pixels, the photoelectric conversion elements into which the colors separated from the first meta-pattern area MA1, the second meta-pattern area MA2, and the fourth meta-pattern area MA4 are incident may be different from each other.

For example, the light 4L1 incident on the first meta-pattern area MA1 of FIG. 4 may be separated into red light, green light, and blue light due to the meta-structure of the first meta-pattern area MA1. In such an example, the red light may be incident on the first photoelectric conversion element PE1 under the first meta-pattern area MA1, the green light may be incident on the second photoelectric conversion element PE2 belonging to the G pixel, and the blue light may be incident on the fourth photoelectric conversion element PE4 adjacent to the first photoelectric conversion element PE1 in a diagonal direction and belonging to the B pixel.

For another example, the light 4L1 incident on the second and third meta-pattern areas MA2 and MA3 of FIGS. 4 and 5 may also be separated into red light, green light, and blue light. In such an example, the green light may be incident on the second photoelectric conversion element PE2 under the second meta-pattern area MA2 and the third photoelectric conversion element PE3 under the third meta-pattern area MA3, the red light may be incident on the first photoelectric conversion element PE1 belonging to the R pixel, and the blue light may be incident on the fourth photoelectric conversion element PE4 adjacent in the horizontal and vertical directions.

For another example, the light 4L1 incident on the fourth meta-pattern area MA4 of FIG. 5 may also be separated into red light, green light, and blue light. In such an example, the separated blue light may be incident on the fourth photoelectric conversion element PE4 under the fourth meta-pattern area MA4, and the separated red light is incident on the first photoelectric conversion element PE1 adjacent to the fourth photoelectric conversion element PE4 in a diagonal direction and belonging to the R pixel, and the separated green light may be incident on the second and/or third photoelectric conversion elements PE2 and PE3 adjacent to the fourth photoelectric conversion element PE4 and belonging to the G pixel.

Figure 12:
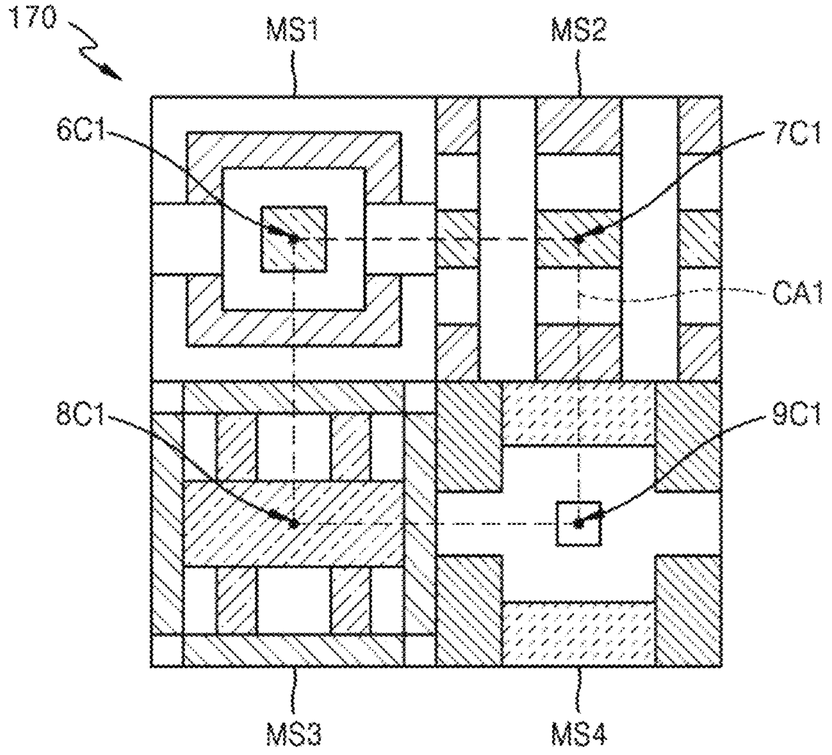
FIG. 12 is a plan view illustrating the first to fourth meta-structures exemplarily shown in FIGS. 8 to 11 together, according to an example embodiment.

FIG. 12 is a plan view illustrating the above-described exemplary first to fourth meta-structures MS1 to MS4 together, according to an embodiment. FIG. 12 may be a plan view illustrating the color routing meta-structure layer 170 of the unit pixel 130 as an example. The first to fourth meta-structures MS1 to MS4 may correspond to the first to fourth meta-pattern areas MA1 to MA4, respectively, and may be seen as the first to fourth meta-pattern areas MA1 to MA4 in the plan view of FIG. 12.

Referring to FIG. 12, reference number CA1 may denote a meta-structure area including the center area of the color routing meta-structure layer 170. The meta-structure area CA1 may not be a physically divided area, but may be an area set for convenience for explanation.

The size and/or area of the meta-structure area CA1 may be substantially similar and/or the same as the size and/or area of each of the first to fourth meta-structures MS1 to MS4. The meta-structure area CA1 may be set to include a part of each of the meta-structures MS1 to MS4. For example, on a plane, the meta-structure area CA1 may include one fourth (e.g., ¼) of each of the first to fourth meta-structures MS1 to MS4. For example, the meta-structure area CA1 may include the fourth quadrant of the first meta-structure MS1, the third quadrant of the second meta-structure MS2, the first quadrant of the third meta-structure MS3, and the second quadrant of the fourth meta-structure MS4.

Since the meta-structure included in the meta-structure area CA1 may be composed of parts of each of the first to fourth meta-structures MS1 to MS4 having different meta-structures, the meta-structure area CA1 may not have symmetry. However, the present disclosure is not limited in this regard. For example, in an embodiment, the meta-structure area CA1 may have symmetry.

To improve autofocus performance, the first to fourth meta-structures MS1 to MS4 of the color routing meta-structure layer 170 may each have their own symmetry, and in the meta-structure area CA1, the first to fourth meta-structures MS1 to MS4 may be freely designed so that each of the first to fourth meta-structures MS1 to MS4 has the symmetry. Accordingly, the meta-structure area CA1 may be referred to as a free design area in which a meta-structure is freely designed.

For example, a meta-structure may be formed in an arbitrary shape in a portion belonging to each of the meta-structures MS1 to MS4 in the meta-structure area CA1. However, meta-structures may be formed in different shapes in portions belonging to each of the meta-structure MS1 to MS4 in the meta-structure area CA1. For example, an arbitrary type of meta-structure (hereinafter referred to as a first seed meta-structure and/or a first unit meta-structure) may be formed in a portion of the meta-structure area CA1 belonging to the first meta-structure MS1, an arbitrary type of meta-structure (hereinafter referred to as a second seed meta-structure and/or a second unit meta-structure) may be formed in a portion of the meta-structure area CA1 belonging to the second meta-structure MS2, an arbitrary type of meta-structure (hereinafter referred to as a third seed meta-structure and/or a third unit meta-structure) may be formed in a portion of the meta-structure area CA1 belonging to the third meta-structure MS3, and an arbitrary type of meta-structure (hereinafter referred to as a fourth seed meta-structure and/or a fourth unit meta-structure) may also be formed in a portion of the meta-structure area CA1 belonging to the fourth meta-structure MS4. The first to fourth seed meta-structures may be different meta-structures from each other, and many meta-patterns may be provided to have different shapes from each other on a plane.

In an embodiment, the first seed meta-structure may correspond to the meta-structure formed in the fourth quadrant of the first meta-structure MS1. In order to form the first meta-structure MS1, the first seed meta-structure may be repeated so that the first meta-structure MS1 may be left-right symmetrical about the first reference line 8L1 in FIG. 8. Alternatively or additionally, the repeated result may be repeated again so as to be up-down symmetric about the second reference line 8L2. For example, in order to form the first meta-structure MS1, the first seed meta-structure may be repeated so as to be up-down symmetrical around the second reference line 8L2. Alternatively or additionally, the repeated result may be repeated again so as to be left-right symmetric about the first reference line 8L1.

In an embodiment, the second seed meta-structure may correspond to the meta-structure formed in the third quadrant of the second meta-structure MS2. In order to form the second meta-structure MS2, the second seed meta-structure may be repeated so that the second meta-structure MS2 may be left-right symmetrical about the horizontal and/or vertical reference lines 9L1 and 9L2 in FIG. 9 passing through the center of symmetry 7C1. Alternatively or additionally, the repeated result may be repeated again so as to be up-down symmetrical about the horizontal and/or vertical reference lines 9L1 and 9L2.

In an embodiment, the third seed meta-structure may correspond to the meta-structure formed in the first quadrant of the third meta-structure MS3. In order to form the third meta-structure MS3, the third seed meta-structure may be repeated so that the third meta-structure MS3 may be left-right symmetrical about the horizontal and/or vertical reference lines 10L1 and 10L2 in FIG. 10 passing through the center of symmetry 8C1. Alternatively or additionally, the repeated result may be repeated so as to be up-down symmetrical about the horizontal and/or vertical reference lines 10L1 and 10L2.

In an embodiment, the fourth seed meta-structure may correspond to the meta-structure formed in the second quadrant of the fourth meta-structure MS4. In order to form the fourth meta-structure MS4, the fourth seed meta-structure may be repeated so that the fourth meta-structure MS4 may be left-right symmetrical about the horizontal and/or vertical reference lines 11L1 and 11L2 in FIG. 11 passing through the center of symmetry 9C1. Alternatively or additionally, the repeated result may be repeated so as to be up-down symmetrical about the horizontal and/or vertical reference lines 11L1 and 11L2.

As such, since the first to fourth meta-structures MS1 to MS4 may be repetitions of the first to fourth seed meta-structures having different meta-structures, each of the meta-structures MS1 to MS4 may have independent symmetry. That is, each of the meta-structures MS1 to MS4 may include meta-patterns formed to have independent symmetry.

Since the meta-structures may be created by combining a plurality of meta-patterns, meta-patterns having various forms may be distributed in various forms in the meta-structure area CAL Accordingly, the first to fourth meta-structures MS1 to MS4 may be modified to have various meta-structures different from each other.

The color routing meta-structure layer 170 may be formed through processes of setting an objective function (e.g., model) to achieve set color separation and/or auto focus and/or to obtain the desired optical properties. That is, the color routing meta-structure layer 170 may be formed from a meta-structure that may satisfy the objective function in the meta-structure area CA1 while keeping the independent symmetry of each of the first to fourth meta-structures MS1 to MS4. The process of forming a meta-structure that may satisfy the objective function may include a process of inputting information on various meta-structures into the objective function. This process may be repeated until a meta-structure satisfying the objective function is found. Each time this process is repeated, the information input to the objective function may change. For example, the information on the meta-structure may include the width, diameter, pitch, material, refractive index, and/or dimensions defining the shape of the meta-pattern constituting the meta-structure. However, the present disclosure may not be limited in this regard. For example, one of the optical characteristics may include a characteristic that the same optical efficiency may be obtained in each pixel regardless of the polarization of the incident light. Consequently, in the case of the image sensor 100 provided with the exemplary color routing meta-structure layer 170, the same light efficiency may be obtained in each pixel regardless of the polarization state of incident light, as described with reference to FIG. 19.

Figure 13:
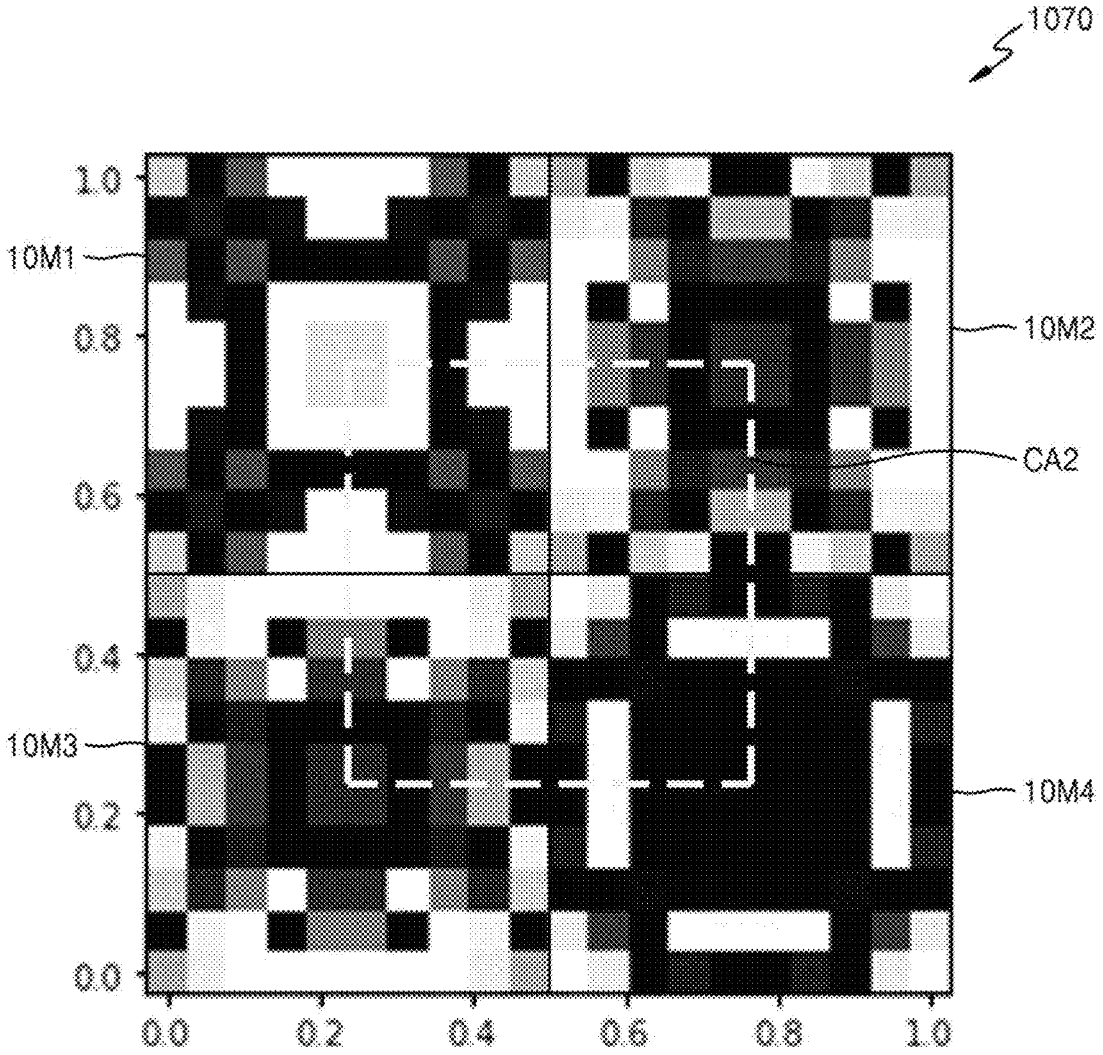
FIG. 13 is a plan view of a color routing meta-structure layer (meta-optical device) according to an example embodiment implemented by simulation, according to an example embodiment.

FIG. 13 shows an example embodiment of a color routing meta-structure layer 1070 implemented through simulation to satisfy the above objective function, according to an embodiment.

Referring to FIG. 13, the color routing meta-structure layer 1070 may include four meta-structures (e.g., first meta-structure 10M1, second meta-structure 10M2, third meta-structure 10M3, and fourth meta-structure 10M4). Each of the first to fourth meta-structures 10M1 to 10M4 may have an independent symmetry. However, there may be no symmetry between each of the first to fourth meta-structures 10M1 to 10M4. Alternatively or additionally, the meta-structure of the central area CA2 corresponding to the meta-structure area CA1 of the color routing meta-structure layer 170 of FIG. 12 may include respective portions of the first to fourth meta-structures 10M1 to 10M4, however, the first to fourth meta-structures 10M1 to 10M4 may not have symmetry with each other.

For example, the central area CA2 of the color routing meta-structure layer 1070 may be an area where the meta-structure is freely designed so that the color routing meta-structure layer 1070 satisfies the objective function. Each of the first to fourth meta-structures 10M1 to 10M4 may be designed to have symmetry based on a part belonging to each of the first to fourth meta-structures 10M1 to 10M4 in the meta-structure designed in the central area CA2. Conversely, each of the first to fourth meta-structures 10M1 to 10M4 may have independent symmetry while satisfying the objective function, however, the first to fourth meta-structures 10M1 to 10M4 may be formed so as not to have symmetry between each of the first to fourth meta-structures 10M1 to 10M4, and as such, a meta-structure that may not naturally have symmetry may be formed in the central area CA2.

In an embodiment, the color routing meta-structure layer 170 of FIGS. 4 to 7 may be and/or include a single layer of a three-dimensional structure. In an optional or additional embodiment, as shown in FIG. 14, the color routing meta-structure layer 170 may include color routing meta-structure layers (e.g., first color routing meta-structure layer 170A, second color routing meta-structure layer 170B, third color routing meta-structure layer 170C, fourth color routing meta-structure layer 170D, and fifth color routing meta-structure layer 170E) that may be sequentially stacked.

Figure 14:
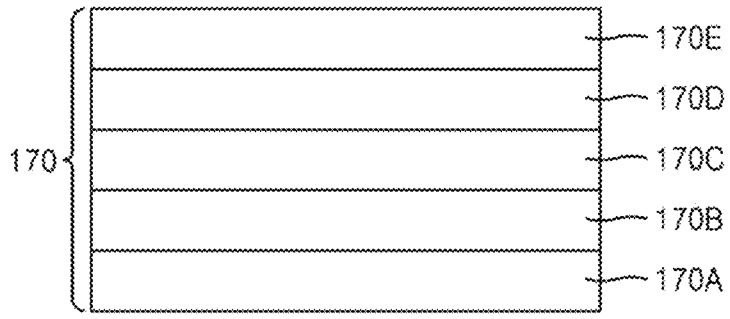
FIG. 14 is a cross-sectional view illustrating a case in which a color routing meta-structure layer according to an example embodiment includes multiple layers, according to an example embodiment.

It is to be understood that the layer structure of the color routing meta-structure layer 170 of FIG. 14 is exemplary, and that the color routing meta-structure layer 170 may include fewer layers (e.g., less than five (5)) and/or additional layers (e.g., more than five (5)). For example, the color routing meta-structure layer 170 may include only two layers among the first to fifth color routing meta-structure layers 170A to 170E.

Planar areas of the first to fifth color routing meta-structure layers 170A to 170E may be substantially similar and/or be the same as each other. Alternatively or additionally, the first to fifth color routing meta-structure layers 170A to 170E may have different meta-structures. Accordingly, the meta-structures formed in the first to fifth color routing meta-structure layers 170A to 170E may not have a symmetrical relationship with each other. That is, there may be no symmetric relationship between the meta-structures formed in the first to fifth color routing meta-structure layers 170A to 170E.

In the first to fifth color routing meta-structure layers 170A to 170E, the meta-structure of each layer may be provided in a form capable of achieving color routing of incident light as described with reference to FIG. 1.

In embodiments in which the color routing meta-structure layer 170 includes 2 layers, 3 layers, and/or 4 layers, the meta-structure of each layer may be provided in a form capable of achieving color routing of incident light as described with reference to FIG. 1.

Figure 15:
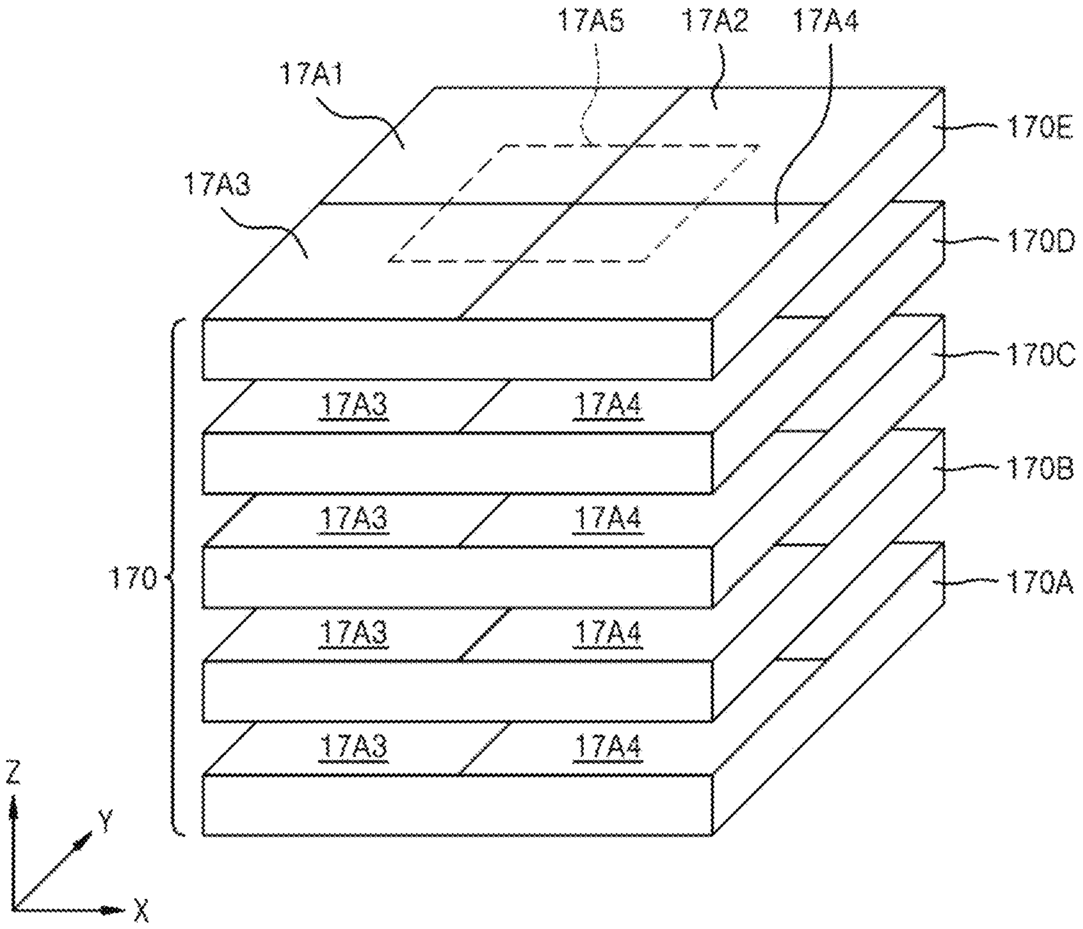
FIG. 15 is an exploded perspective view of a color routing meta-structure layer including first to fifth color routing meta-structure layers of FIG. 14, according to an example embodiment.

FIG. 15 is an exploded perspective three-dimensional (3D) view illustrating the color routing meta-structure layer 170 including the first to fifth color routing meta-structure layers 170A to 170E.

As shown in FIG. 15, each of the first to fifth color routing meta-structure layers 170A to 170E may include first to fourth meta-structure areas 17A1 to 17A4 in which meta-structures are formed. For convenience of illustration, the meta-structures (e.g., meta-patterns) are not shown in the first to fourth meta-structure areas 17A1 to 17A4 in FIG. 15.

In each layer of the first to fifth color routing meta-structure layers 170A to 170E, the meta-structures formed in the first to fourth meta-structure areas 17A1 to 17A4 may be different from each other. For example, the meta-structures formed in the first meta-structure areas 17A1 of the first to fifth color routing meta-structure layers 170A to 170E may be different from each other. For another example, the meta-structures formed in the second meta-structure areas 17A2 of the first to fifth color routing meta-structure layers 170A to 170E may be different from each other. Alternatively or additionally, the meta-structures formed in the third meta-structure areas 17A3 of the first to fifth color routing meta-structure layers 170A to 170E may be different from each other. For another example, the meta-structures formed in the fourth meta-structure areas 17A4 of the first to fifth color routing meta-structure layers 170A to 170E may be different from each other. That is, when viewing on a planar view, the result of vertically overlapping the meta-structures formed in the first meta-structure areas 17A1 of the first to fifth color routing meta-structure layers 170A to 170E may be and/or correspond to the first meta-structure MS1 of the color routing meta-structure layer 170 of FIG. 12.

Figure 16:
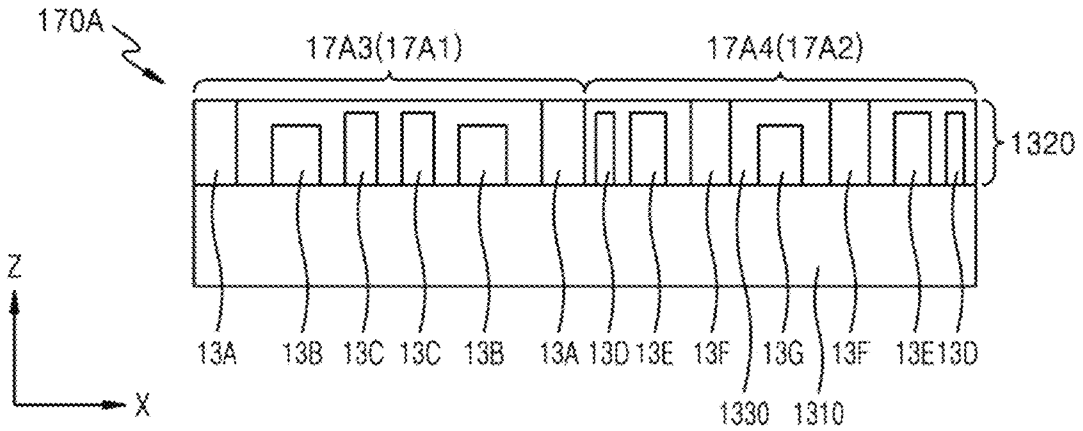
FIG. 16 is a cross-sectional view illustrating the first color routing meta-structure layer of FIG. 14 as an example, according to an example embodiment.

FIG. 16 is a cross-sectional view illustrating the first color routing meta-structure layer 170A as an example. FIG. 16 is a cross-sectional view perpendicular to the Y-axis, and may be a cross section of the first and second meta-structure areas 17A1 and 17A2 or the third and fourth meta-structure areas 17A3 and 17A4 cut in a direction parallel to a plane formed by the X-axis and the Z-axis (e.g., a X-Z plane).

Referring to FIG. 16, the first color routing meta-structure layer 170A may include a substrate 1310 and a meta-surface 1320 formed on the substrate 1310. The meta-surface 1320 may also be referred to as a meta-surface layer. The substrate 1310 may be and/or include a substrate that may be transparent to incident light and/or may include a substrate formed of a material that may not absorb and/or may not substantially absorb incident light. For example, the substrate 1310 may be a related substrate on which a meta-surface may be formed. In an embodiment, the substrate 1310 may correspond to the intermediate layer (e.g., spacer) 160 described with reference to FIGS. 3 and 4. For example, the substrate 1310 may correspond to the photoelectric conversion layer 150 shown in FIGS. 6 and 7 and/or include the photoelectric conversion layer 150.

The meta-surface 1320 may include meta-patterns (e.g., first meta-pattern 13A, second meta-pattern 13B, third meta-pattern 13C, fourth meta-pattern 13D, fifth meta-pattern 13E, sixth meta-pattern 13F, and seventh meta-pattern 13G) and a protective layer 1330 having different refractive indices from each other. A dimension (e.g., height, width, thickness, pitch) of each of the meta-patterns 13A to 13G may be smaller than the wavelength of the incident light. For example, the height and/or lateral width of each of the meta-patterns 13A to 13G may be smaller than the wavelength of the incident light. For another example, the interval and/or pitch of each of the meta-patterns 13A to 13G may be smaller than the wavelength of the incident light. The plurality of meta-patterns 13A, 13B, and 13C included in the third meta-structure area 17A3 may be aligned so as to be left-right symmetrical. Alternatively or additionally, the plurality of meta-patterns 13D and 13E included in the fourth meta-structure area 17A4 may be arranged so as to be left-right symmetrical. However, the number and/or arrangement of the plurality of meta-patterns 13A, 13B, and 13C included in the third meta-structure area 17A3 may be different from the number and/or arrangement of the plurality of meta-patterns 13D and 13E included in the fourth meta-structure area 17A4. For example, the number of meta-patterns 13A to 13C included in the third meta-structure area 17A3 and the number of meta-patterns 13D to 13G included in the fourth meta-structure area 17A4 may be the same, however, the arrangement of the meta-patterns 13A to 13C may be different from the arrangement of the meta-patterns 13D to 13G. For example, the third and fourth meta-structure areas 17A3 and 17A4 may include the same number of meta-patterns, and in each of the meta-structure areas 17A3 and 17A4, the meta-patterns may be arranged symmetrically, however, the arrangement of meta-patterns in the third meta-structure area 17A3 may be different from the arrangement of meta-patterns in the fourth meta-structure area 17A4. These characteristics related to the meta-patterns 13A to 13G between the third and fourth meta-structure areas 17A3 and 17A4 may be applied between the first and second meta-structure areas 17A1 and 17A2, and/or may also be applied between the first and third meta-structure areas 17A1 and 17A3 and between the second and fourth meta-structure areas 17A2 and 17A4. A portion of the plurality of meta-patterns 13A to 13G may be covered with the protective layer 1330. The top surface of some of the plurality of meta-patterns 13A to 13G may be at the same height and/or substantially the same height as the top surface of the protective layer 1330, such that the same plane as the upper surface of the protective layer 1330 may be formed. An upper surface of the protective layer 1330 may be parallel to a surface of the substrate 1310 on which the plurality of meta-patterns 13A to 13G may be formed, and/or may be flat.

In an embodiment, the protective layer 1330 may include a material that may have a refractive index smaller than a refractive index of the plurality of meta-patterns 13A to 13G and may be transparent to incident light. For example, the material of the protective layer 1330 may be the same as that of the transparent material layer 17TM described in FIG. 4, but may be different from each other. The meta-patterns 13A to 13G may include a material such as, but not limited to, titanium oxide ($TiO_2$).

Figure 17:
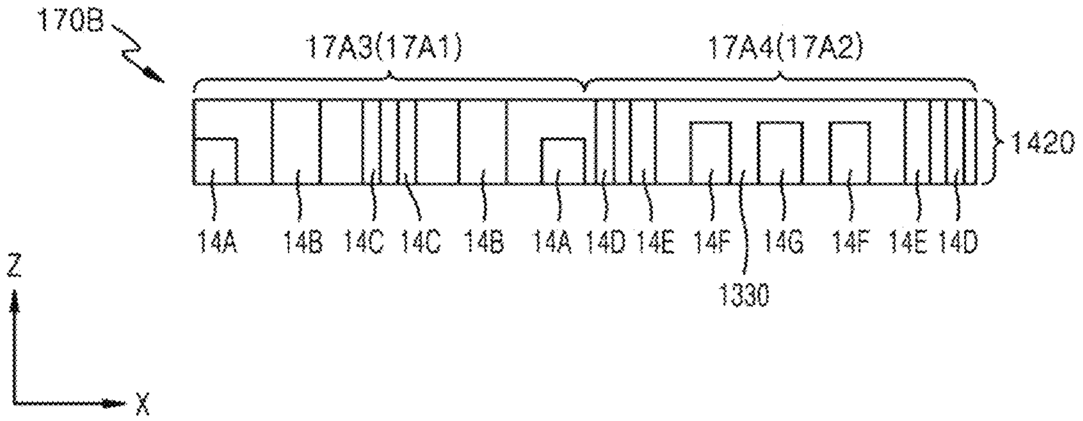
FIG. 17 is a cross-sectional view illustrating the second color routing meta-structure layer of FIG. 14 as an example, according to an example embodiment.

FIG. 17 is a cross-sectional view illustrating the second color routing meta-structure layer 170B of FIG. 15 as an example, according to an embodiment.

Referring to FIG. 17, the second color routing meta-structure layer 170B may include a meta-surface 1420 formed on the first color routing meta-structure layer 170A illustrated in FIG. 16. In an embodiment, the first color routing meta-structure layer 170A and the meta-surface 1420 may be in direct contact with each other. For example, a member (e.g., a material layer) transparent to the incident light may be provided between the first color routing meta-structure layer 170A and the meta-surface 1420.

The plurality of meta-patterns (e.g., first meta-pattern 14A, second meta-pattern 14B, third meta-pattern 14C, fourth meta-pattern 14D, fifth meta-pattern 14E, sixth meta-pattern 14F, and seventh meta-pattern 14G) included in the meta-surface 1420 of the second color routing meta-structure layer 170B may be aligned with left-right symmetry in the third meta-structure area 17A3. Alternatively or additionally, the plurality of meta-patterns may be aligned with left-right symmetry in the fourth meta-structure area 17A4. However, the alignment form (e.g., meta-structure) of the meta-patterns 14A to 14C included in the third meta-structure area 17A3 may be different from the alignment form (e.g., meta-structure) of the meta-patterns 14D to 14G included in the fourth meta-structure area 17A4.

Comparing FIGS. 16 and 17, the alignment form (e.g., meta-structure) of the meta-patterns 13A to 13C included in the third meta-structure area 17A3 of the first color routing meta-structure layer 170A may be different from the alignment form (e.g., meta-structure) of the meta-patterns 14A to 14C included in the third meta-structure area 17A3 of the second color routing meta-structure layer 170B. The alignment form (e.g., meta-structure) of the meta-patterns 13D to 13G included in the fourth meta-structure area 17A4 of the first color routing meta-structure layer 170A may be different from the alignment form (e.g., meta-structure) of the meta-patterns 14D to 14G included in the fourth meta-structure area 17A4 of the second color routing meta-structure layer 170B.

In an embodiment, each of the third to fifth color routing meta-structure layers 170C to 170E of FIG. 15 may include a meta-surface, in a manner similar to the second color routing meta-structure layer 170B including the meta-surface 1420. However, in a manner similar to the meta-structure characteristics of the meta-surfaces 1320 and 1420 of the first and second color routing meta-structure layers 170A and 170B being different from each other, the meta-structure characteristics of the meta-surfaces of the third to fifth color routing meta-structure layers 170C to 170E may be different from each other. Alternatively or additionally, the meta-structure characteristics of the meta-surfaces of the third to fifth color routing meta-structure layers 170C to 170E may be different from the meta-structural characteristics of the meta-surfaces 1320 and 1420 of the first and second color routing meta-structure layers 170A and 170B.

As described above, since the meta-structures between the vertically stacked first to fifth color routing meta-structure layers 170A to 170E may be different from each other, even when the constituent materials of each layer of the first to fifth color routing meta-structure layers 170A to 170E may be the same, the refractive index in the vertical direction of the multi-layered color routing meta-structure layer 170 may be different. However, the refractive index in the vertical direction may be constant at a certain location where the meta-structures between the first to fifth color routing meta-structure layers 170A to 170E partially overlap. When the refractive index in the vertical direction is changed, the refractive index change may be continuous and/or discontinuous depending on the position.

For example, constituent materials of the first to fifth color routing meta-structure layers 170A to 170E may be different for each layer. Taking the first color routing meta-structure layer 170A and the second color routing meta-structure layer 170B as an example, the first color routing meta-structure layer 170A may include a first material and a second material having different refractive indices from each other, and the second color routing meta-structure layer 170B may include a third material and a fourth material having different refractive indices from each other. In such an example, at least one of the first material and the second material and at least one of the third material and the fourth material may be the same material. As a result, when the constituent materials of each layer of the first to fifth color routing meta-structure layers 170A to 170E are different from each other, even when the meta-structure between the first to fifth color routing meta-structure layers 170A-170E are not only different but also the same, refractive indices in the vertical direction may be different.

In an embodiment, layer constituent materials of some of the first to fifth color routing meta-structure layers 170A to 170E may be different from those of other layers. For example, the layer constituent materials of the first and second color routing meta-structure layers 170A and 170B may be the same each other, but may be different from those of the third to fifth color routing meta-structure layers 170C to 170E. In such an example, the layer constituent materials of the third to fifth color routing meta-structure layers 170C to 170E may be the same and/or different from each other. As a result, when the layer constituent materials of some layers of the first to fifth color routing meta-structure layers 170A to 170E are different from those of the other layers, since the first to fifth color routing meta-structure layers 170A to 170E have different meta-structures from each other, the refractive index in the vertical direction of the color routing meta-structure layer 170 may vary, and the refractive index in the vertical direction may be constant only at a certain location.

Figure 18:
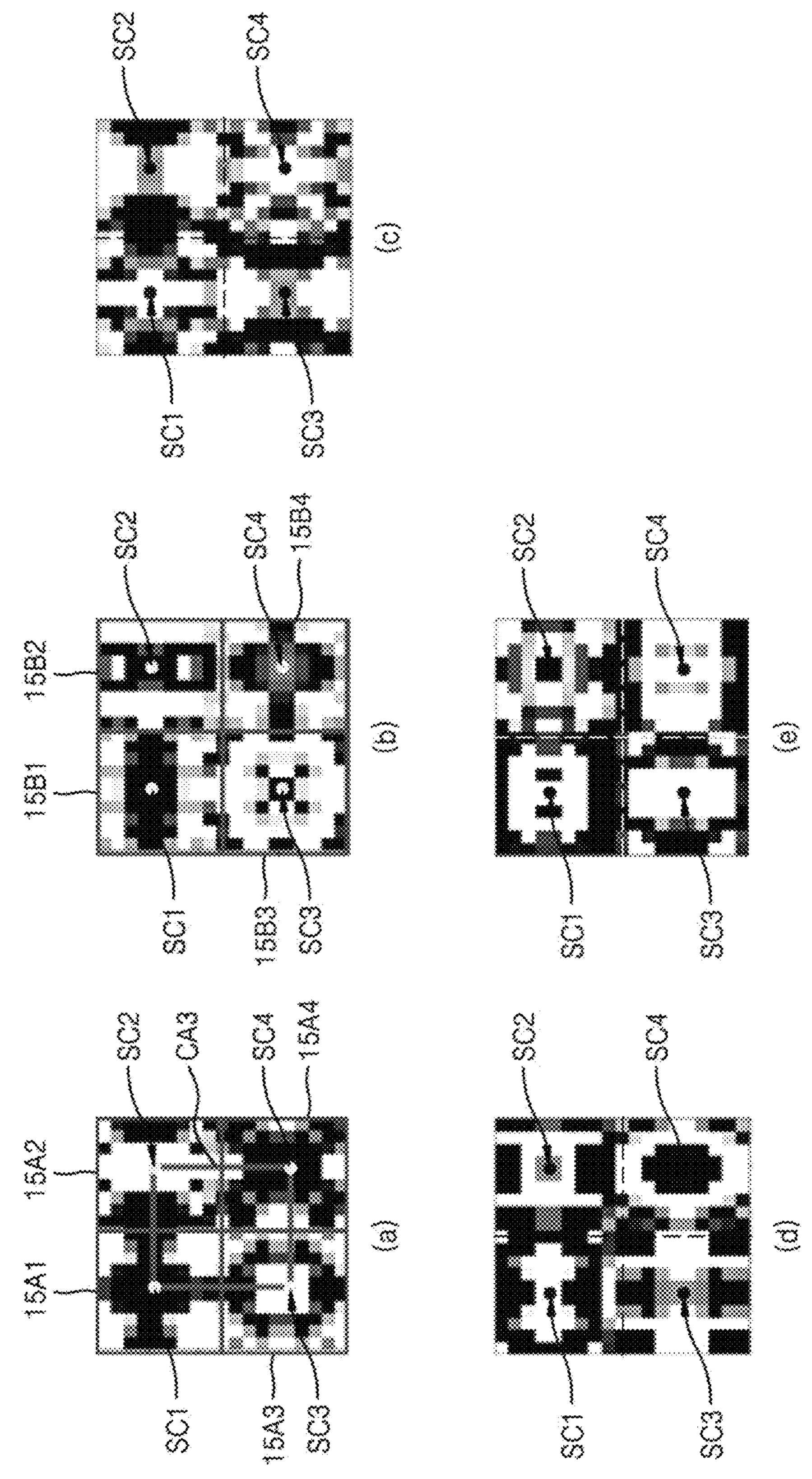
FIG. 18 is a plan view illustrating first to fifth color routing meta-structure layers constituting the color routing meta-structure layer implemented by the simulation of FIG. 13, according to an example embodiment.

FIG. 18 is an example of a case in which the color routing meta-structure layer 1070 implemented by the simulation of FIG. 13 is multi-layered, according to an embodiment. Referring to FIG. 18, first to fifth color routing meta-structure layers (a) to (e) constituting the color routing meta-structure layer 1070 are shown. The first to fifth color routing meta-structure layers (a) to (e) may be formed with simulation so as to form the color routing meta-structure layer 1070 by sequentially stacking the first to fifth color routing meta-structure layers (a) to (e).

Continuing to refer to FIG. 18, it may be seen that each of the first to fifth color routing meta-structure layers (a) to (e) has a meta-structure having symmetry, but the meta-structural characteristics of each of the first to fifth color routing meta-structure layers (a) to (e) are different from each other. Taking the first and second color routing meta-structure layers (a) and (b) as an example, the first to fourth meta-structures 15A1 to 15A4 of the first color routing meta-structure layer (a) and the first to fourth meta-structures 15B1 to 15B4 of the second color routing meta-structure layer (b) are located at positions corresponding to the first to fourth meta-structures 10M1 to 10M4 of the color routing meta-structure layer 1070 of FIG. 13, and each independently has symmetry. However, the first to fourth meta-structures 15A1 to 15A4 of the first color routing meta-structure layer (a) are different from each other, and the first to fourth meta-structures 15B1 to 15B4 of the second color routing meta-structure layer (b) are also different from each other. The meta-structure of the first color routing meta-structure layer (a) is also different from the meta-structure of the entire second color routing meta-structure layer (b). Reference number CA3 in the first color routing meta-structure layer (a) denotes a central area corresponding to the central area CA2 of the color routing meta-structure layer 1070 of FIG. 13. Reference numbers SC1 to SC4 denote centers of symmetry, and may correspond to pixel centers on a plane.

Figure 19:
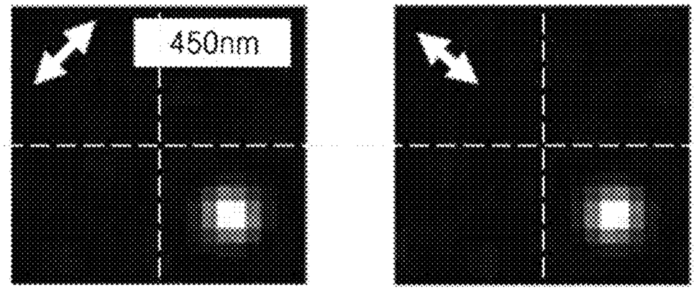
FIGS. 19 to 21 are simulation pictures showing simulation results performed to check polarization characteristics or polarization dependence of an image sensor including a color routing meta-structure layer, according to an example embodiment.
Figure 20:
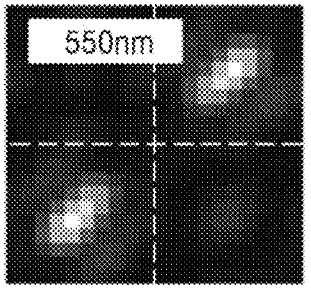
Figure 20:
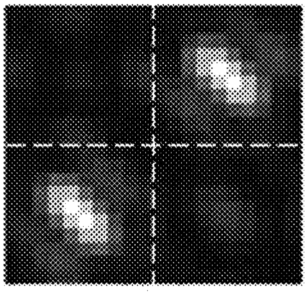
Figure 21:
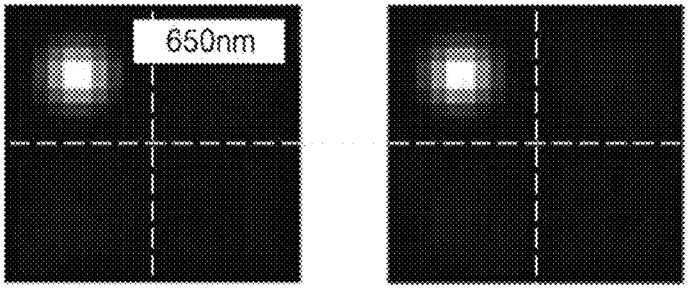

FIGS. 19 to 21 show simulation results performed to check polarization characteristics or polarization dependence of the image sensor 100 including the color routing meta-structure layer, according to an example embodiment. In such a simulation, the color routing meta-structure layer may be set to be the color routing meta-structure layer 1070 of FIG. 13.

FIG. 19(*a*) shows a simulation result when a first incident light having a wavelength of 450 nm and linearly polarized in a first direction (e.g., +45° direction) is incident on the color routing meta-structure layer. FIG. 19(*b*) shows a simulation result when a second incident light having a wavelength of 450 nm and linearly polarized in a second direction perpendicular to the first direction (e.g., +135° direction) is incident to the color routing meta-structure layer. In (a) and (b) of FIG. 19, double-headed arrows indicate the direction of linear polarization of incident light.

Comparing (a) and (b) of FIG. 19, both the first and second incident light may be received in the central area of a pixel receiving blue light B. The spot (e.g., brightest part) of the first incident light may be concentrated on the center of a corresponding pixel and may have vertical and horizontal symmetry (e.g., left-right symmetry and up-down symmetry). In a similar manner to the spot of the first incident light in (a), the spot of the second incident light in (b) may be concentrated on the center of the corresponding pixel and may have vertical and horizontal symmetry.

The results of FIG. 19 may show that the image sensor 100 may not exhibit linear polarization dependence on incident light in the 450 nm band. That is, the results of FIG. 19 may suggest that when incident light in the blue light band is incident on the image sensor 100, light efficiency of the image sensor 100 may not be affected by polarization characteristics of the incident light.

FIG. 20(*a*) shows a simulation result when the third incident light having a wavelength of 550 nm and linearly polarized in the first direction is incident on the color routing meta-structure layer. FIG. 20(*b*) shows a simulation result when the fourth incident light having a wavelength of 550 nm and linearly polarized in the second direction is incident to the color routing meta-structure layer.

Comparing (a) and (b) of FIG. 20, both the third and fourth incident lights may be received by pixels receiving green light G, and the spot (e.g., brightest part) of the third incident light in a corresponding pixel may be located at the center of the pixel, may have symmetry, and may be limitedly spread in a given direction. The spot of the fourth incident light may have substantially the same distribution shape and symmetry as the spot of the third incident light and may be limitedly spread. However, the spread direction of the spot of the fourth incident light may be perpendicular to the spread direction of the spot of the third incident light.

Although the spots of the third and fourth incident light may be restrictedly spread and the spreading directions may be perpendicular to each other, since the spots of the third and fourth incident light may be formed at the center of the pixel, and the spread area of the spot may be gathered at the center of the pixel, both the third and fourth incident light spots may be considered to be formed at the center of a pixel.

The results of FIG. 20 may show that the image sensor 100 may not exhibit linear polarization dependence even for incident light in a 550 nm band. That is, the results of FIG. 20 may suggest that even when incident light in the green light band is incident on the image sensor 100, the optical efficiency of the image sensor 100 may not be affected by the polarization characteristics of the incident light.

FIG. 21(*a*) shows a simulation result when the fifth incident light having a wavelength of 650 nm and linearly polarized in the first direction is incident on the color routing meta-structure layer. FIG. 21(*b*) shows a simulation result when the sixth incident light having a wavelength of 650 nm and linearly polarized in the second direction is incident to the color routing meta-structure layer.

Comparing (a) and (b) of FIG. 21, both the fifth and sixth incident lights may be received in the central area of a pixel receiving red light R, and the spot of the fifth incident light may be concentrated on the center of a corresponding pixel and may have vertical and horizontal symmetry. The sixth incident light may have substantially similar and/or the same spot characteristics and symmetry as those of the fifth incident light.

The results of FIG. 21 may show that the image sensor 100 may not exhibit linear polarization dependence even for incident light in a 650 nm band. That is, the results of FIG. 21 may suggest that even when incident light in the red light band is incident on the image sensor 100, the optical efficiency of the image sensor 100 may not be affected by the polarization characteristics of the incident light.

The results of FIGS. 19 to 21 may suggest that the optical efficiency of the image sensor 100 provided with the exemplary color routing meta-structure layer may not be affected by the polarization characteristics of incident light in the visible light band.

The simulation results of FIGS. 19 to 21 illustrate a case where the light may be perpendicular to the pixel, that is, the incident angle may be 0° and/or may be substantially the same as 0°. "Substantially the same as 0°" may refer to an incident angle where the incident angle may not be equal to 0°, but the size and/or position of the light spot may not change and/or may not show a significant difference from when the incident angle is equal to 0°.

In the simulation used to obtain the results of FIGS. 19 to 21, when the angle of incidence of light incident on a pixel is greater than 0°, that is, when light is obliquely incident, the spot of light formed on the pixel may be different from that of FIGS. 19 to 21, and an R pixel is described with reference to FIG. 22, as an example.

Figure 22:
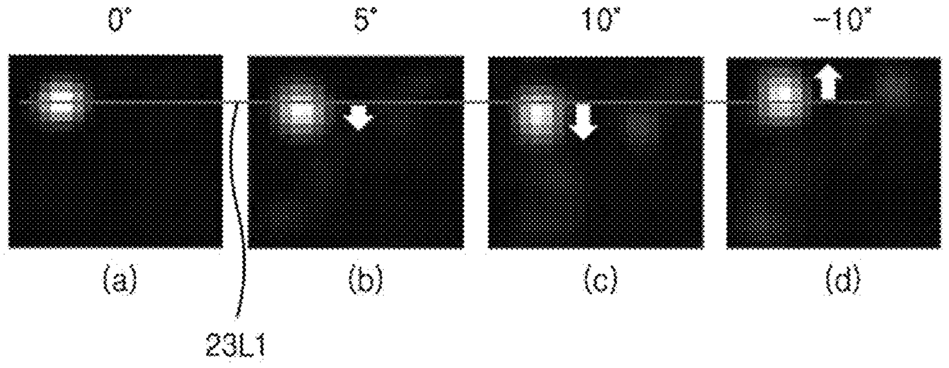
FIG. 22 is a photograph showing a simulation result showing positional movement of a light spot in a red (R) pixel when light is perpendicularly incident to an image sensor including a color separation meta-structure and when light is incident obliquely to an image sensor, according to an example embodiment.

FIG. 22 shows simulation results showing a positional movement of a light spot in an R pixel when light is incident vertically and/or obliquely to an image sensor including a color separation meta-structure, according to an example embodiment. In the simulation used to obtain the simulation results, a light having a wavelength of 650 nm belonging to the red light band was used as the incident light, and the simulation was performed at incident angles of 0°, +5°, +10°, and −10°.

Referring to FIG. 22, image (a) corresponds to the simulation result when the incident angle is 0°, image (b) corresponds to the simulation result when the incident angle is +5°, image (c) corresponds to the simulation result when the incident angle is +10°, and image (d) corresponds to the simulation result when the incident angle is −10°.

As shown in FIG. 22, a virtual horizontal reference line 23L1 is introduced to aid in understanding of the description.

Continuing to refer to FIG. 22, when the incident angle is 0°, the spot of light may be located at the center of the R pixel. The virtual horizontal reference line 23L1 may be considered to pass through the center of the spot of light when the incident angle is 0°. When the incident angle of light is +5°, the spot of light may be slightly moved below the virtual horizontal reference line 23L1. That is, the center of the spot of light may be shifted slightly downward from the center of the R pixel. The spot of light may not be divided and may maintain a single spot state.

When the incident angle of light is +10°, the center of the light spot may be moved more downward from the virtual horizontal reference line 23L1 compared to the incident angle of light being +5°. That is, the center of the spot of light may be moved more downward from the center of the pixel than when the incident light is +5°. The spot of light may not be divided, and may maintain a single spot state.

When the angle of incidence of light is −10°, the spot of light may be moved in a direction opposite to that when the angle of incidence of light is +10°. That is, the center of the spot of light may be moved above the virtual horizontal reference line 23L1. The spot of light may not be divided and may maintain a single spot state.

When light is incident vertically as shown in image (a) of FIG. 22, the light spot is located at the center of the pixel. Accordingly, the upper/lower signal ratio with respect to the center of the pixel may be equal to one (1) and/or be approximately equal to one (1). When light is obliquely incident (e.g., images (b), (c), (d) of FIG. 22), the light spot may move downward and/or upward from the center of the pixel depending on the incident direction while maintaining a single spot state. Accordingly, when light is obliquely incident, a difference between an optical signal measured at an upper side (e.g., lower side) of the center of a pixel and an optical signal measured at the lower side (e.g., the upper side) of the center of the pixel may increase. That is, the upper and lower signal ratios with respect to the center of the pixel may be increased. These results suggest that phase detection autofocus operation is possible.

In the first to fifth color routing meta-structure layers (a) to (e) shown in FIG. 18, each layer may include two areas respectively corresponding to two G pixels, and the meta-structure may be formed in two areas that may have independent symmetry, and there may be no symmetry between the meta-structures in the two areas. However, in another example, the meta-structures of the two areas may be formed to have symmetry with each other.

Figure 23:
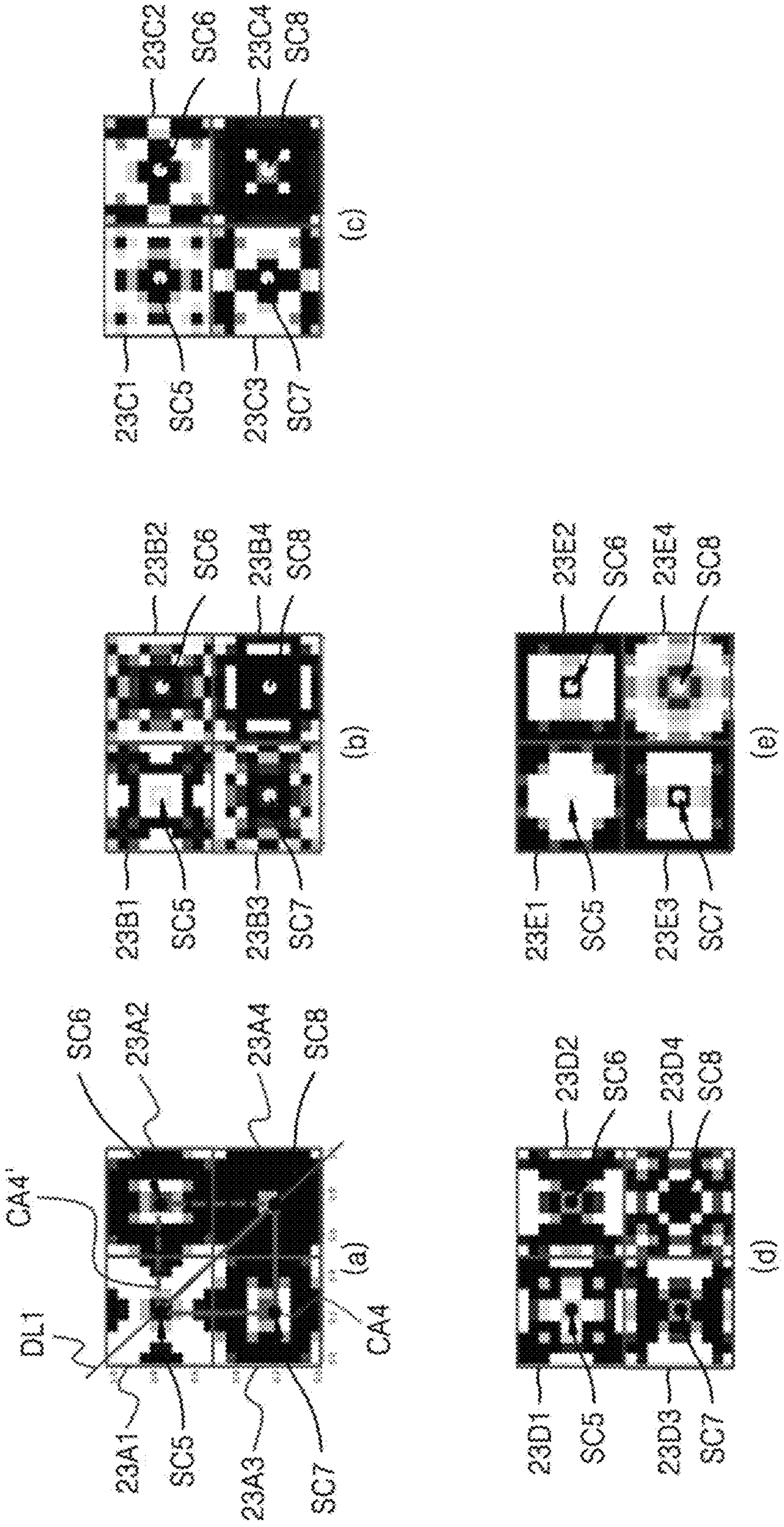
FIG. 23 is a plan view illustrating examples of meta-structures formed in two areas respectively corresponding to two G pixels in the first to fifth color routing meta-structure layers constituting the color routing meta-structure layer implemented by simulation of FIG. 13, according to an example embodiment.

For example, as shown in FIG. 23, areas (e.g. first red area 23A1, second red area 23B1, third red area 23C1, fourth red area 23D1, and fifth red area 23E1) corresponding to R pixels and areas (e.g., first blue area 23A4, second blue area 23B4, third blue area 23C4, fourth blue area 23D4, and fifth blue area 23E4) corresponding to B pixels in each of the color routing meta-structure layers (a) to (e) may include meta-structures having independent symmetry, and two areas (e.g., first green area 23A2, second green area 23A3, third green area 23B2, fourth green area 23B3, fifth green area 23C2, sixth green area 23C3, seventh green area 23D2, eighth green area 23D3, ninth green area 23E2, and tenth green area 23E3) corresponding to the G pixel may also include meta-structures having independent symmetry. However, there may be symmetry between the meta-structures formed in the two areas 23A2 to 23E3 corresponding to the G pixel. Taking the first color routing meta-structure layer (a) as an example, the meta-structures formed in the second and third areas 23A2 and 23A3 corresponding to the G pixels in the first color routing meta-structure layer (a) may be provided so as to be symmetrical to each other with respect to the diagonal line DL1 passing through the centers of symmetry SC5 and SC8 of the first and fourth areas 23A1 and 23A4 and the contact point between the second and third areas 23A2 and 23A3.

To secure this symmetry between the meta-structures formed in the second and third areas 23A2 and 23A3, when forming the first color routing meta-structure layer (a) or setting conditions for formation, the area CA4 in which the meta-structure may be freely designed may be limited differently from the central area CA3 shown in FIG. 18(*a*). For example, the area CA4 in which the meta-structure may be freely designed in the first color routing meta-structure layer (a) may correspond to half of the central area CA3 shown in FIG. 18(*a*), and may be an area that does not include the second area 23A2 and includes one eighth (e.g., ⅛) of the first area 23A1, one fourth (e.g., ¼) of the third area 23A3, and one eighth of the fourth area 23A4. In an embodiment, the area CA4 may be limited in a similar manner to an area CA4' indicated with a dotted line. The area CA4' limited by the dotted line may include the third area 23A3.

As shown in FIG. 23, reference numbers SC5 to SC8 may denote centers of symmetry. The three corners of the free design area CA4 or CA4' may be located at the centers SC5, SC7, and SC8 of symmetry of the first, third and fourth areas 23A1, 23A3, and 23A4, and/or may be located at the centers SC5, SC6, and SC8 of symmetry of the first, second, and fourth areas 23A1, 23A2, and 23A4.

Areas in which the meta-structure may be freely designed in the color routing meta-structure layer may be set in various shapes other than the aforementioned square (e.g., CA1 in FIG. 12, CA2 in FIG. 13, and CA3 in FIG. 18) and/or triangle (e.g., CA4 and CA4' in FIG. 23).

For example, when a pixel layer includes a red pixel, a blue pixel, two green pixels that are arranged in a two-by-two matrix form, the color routing meta-structure layer may include symmetrical meta-structures which are provided directly above the two green pixels and are arranged in a diagonal direction, and non-symmetrical meta-structures that have random and asymmetrical structures, and are provided in a remaining area of the color routing meta-structure layer.

Figure 24:
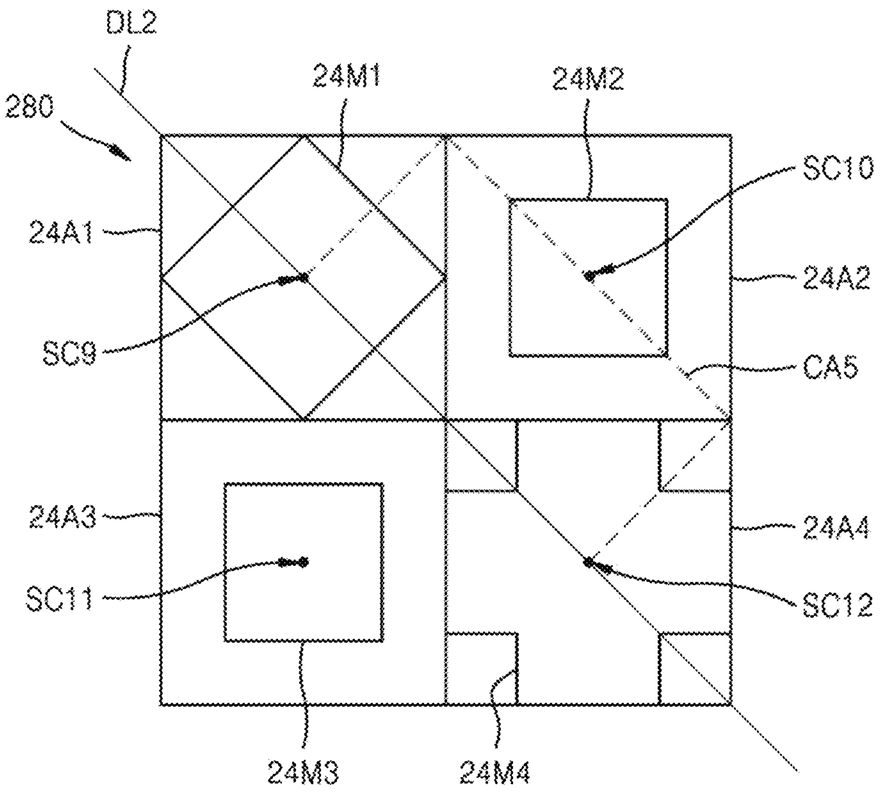
FIG. 24 is a plan view showing another form of a meta-structure free design area set in a color routing meta-structure layer of an image sensor, according to an example embodiment.

FIG. 24 exemplarily shows an example of one or more free design areas, according to an embodiment.

Referring to FIG. 24, the free design area CA5 of the color routing meta-structure layer 280 may be set to be a rectangle. For example, one side of the rectangle may be a diagonal line DL2 passing through centers of symmetry SC9 and SC12 of the first and fourth areas 24A1 and 24A4. In such an example, the free design area CA5 may have a rectangular shape inclined at the same angle as the diagonal line DL2. One side of the rectangular shape may be on the diagonal line DL2. The rectangular shape may be set to include one fourth of the first area 24A1 (e.g., a triangular area connecting vertices of the upper and lower ends of right side of the first area 24A1 to the center of symmetry SC9), half of the second area 24A2 (e.g., an area between the diagonal line DL2 and the imaginary line passing through the center of symmetry SC10 and parallel to the diagonal line DL2), and one fourth of the fourth area 24A4 (e.g., a triangular area connecting the upper left and right vertices of the fourth area 24A4 to the center of symmetry SC12). Alternatively or additionally, the free design area CA5 may not include the third area 24A3 of the color routing meta-structure layer 280.

In order to form the meta-structure 24M1 of the first area 24A1, the seed meta-structure formed in the one fourth of the first area 24A1 included in the rectangular shape CA5 may be repeated so that the first area 24A1 may be symmetrical with respect to the diagonal line DL2. Alternatively or additionally, the repeated result may be repeated again so as to be symmetrical with respect to the +45° diagonal line (e.g., the diagonal line of the first area 24A1 passing through the center of symmetry SC9 and perpendicular to the diagonal line DL2). For example, in order to form the meta-structure 24M1 of the first area 24A1, the seed meta-structure formed in the one fourth of the first area 24A1 included in the rectangular shape CA5 may be repeated so that the first area 24A1 may be symmetrical with respect to the +45° diagonal line, and/or the repeated result may be repeated again so as to be symmetrical with respect to the diagonal line DL2.

Accordingly, the meta-structure 24M1 of the first area 24A1 may be symmetrical with respect to the +45° diagonal line and/or may be symmetrical with respect to the −45° diagonal line, that is, the diagonal line DL2.

In order to form the meta-structure 24M2 of the second area 24A2, the seed meta-structure formed in the half area of the second area 24A2 included in the rectangular shape CA5 may be repeated so that the second area 24A2 may be symmetrical with respect to the virtual line passing through the center of symmetry SC10. Accordingly, the meta-structure 24M2 of the second area 24A2 may be symmetrical with respect to the virtual line parallel to the diagonal line DL2, that is, the −45° diagonal line of the second area 24A2.

The meta-structure 24M3 of the third area 24A3 may formed in a substantially similar and/or the same manner as the meta-structure 24M2 of the second area 24A2 being further formed on the opposite side of the diagonal line DL2 so as to be symmetric with respect to the diagonal line DL2. Therefore, the meta-structure 24M3 of the third area 24A3 may be symmetric about the −45° diagonal line of the third area 24A3 passing through the center of symmetry SC11 of the third area 24A3 and parallel to the diagonal line DL2.

The meta-structure 24M4 of the fourth area 24A4 may be a result from the seed meta-structure formed in the one fourth of the fourth area 24A4 being repeatedly formed on the opposite side of the diagonal line DL2 so that the fourth area 24A4 is symmetrical with respect to the diagonal line DL2, and then the repeatedly formed result may be repeatedly formed on the opposite side of the +45° diagonal line (e.g., a diagonal line passing through the center SC12 of symmetry and perpendicular to the diagonal line DL2) so that the fourth area 24A4 may be symmetrical about the +45° diagonal line. For example, in order to form the meta-structure 24M4 of the fourth area 24A4, the seed meta-structure formed in the one fourth of the fourth area 24A4 may be repeatedly formed on the opposite side of the +45° diagonal line so that the fourth area 24A4 may be symmetrical about the +45° diagonal line, and then the repeatedly formed result may be repeatedly formed on the opposite side of the diagonal line DL2 so that the fourth area 24A4 may be symmetrical with respect to the diagonal line DL2.

Accordingly, the meta-structure 24M4 of the fourth area 24A4 may be symmetric about the +45° diagonal line of the fourth area 24A4 passing through the center of symmetry SC12, and may also be symmetric about the −45° diagonal line, that is, the diagonal line DL2.

Continuing to refer to FIG. 24, the first area 24A1 may correspond to R pixels, the fourth area 24A4 may correspond to B pixels, and the second and third areas 24A2 and 24A3 may correspond to G pixels.

Figure 25:
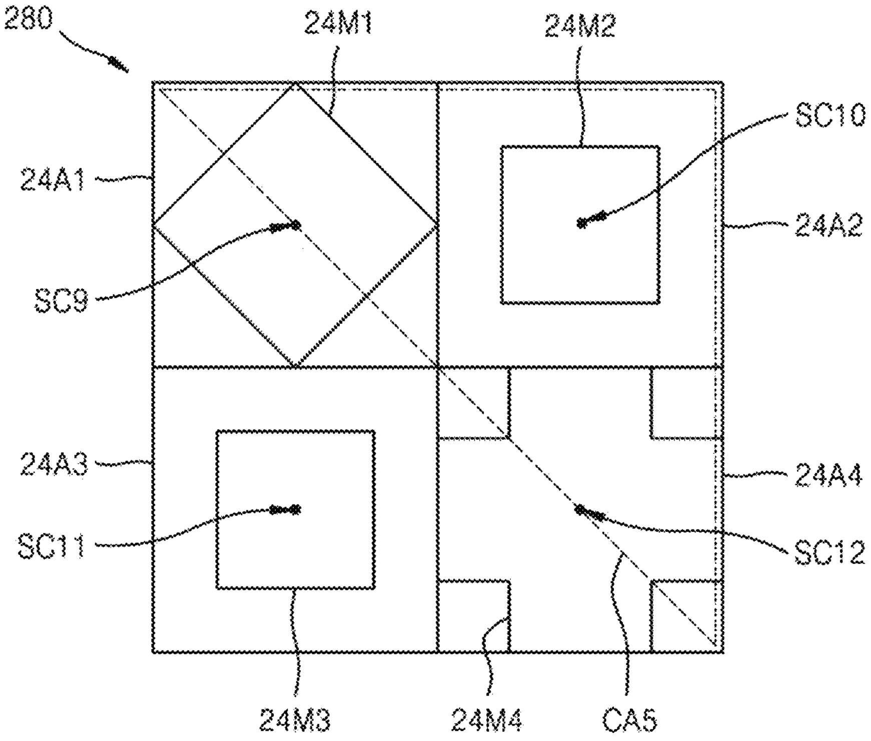
FIG. 25 is a plan view showing a modified example of the meta-structure free design area of FIG. 24, according to an example embodiment.

The free design area CA5 of the color routing meta-structure layer 280 of FIG. 24 may also be applied to the formation of the color routing meta-structure layer 280 described above. In some embodiments, the free design area CA5 of FIG. 24 may be transformed into other shapes. For example, the free design area CA5 may be set in a triangular shape including half of the color routing meta-structure layer 280 as shown in FIG. 25.

Figure 26:
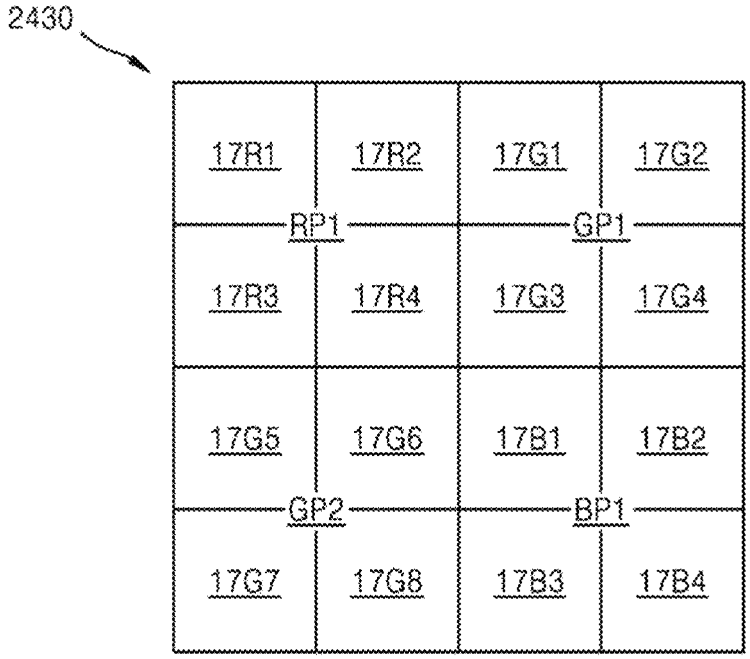
FIG. 26 is a plan view illustrating a unit pixel having a Q cell structure that may replace a unit pixel having a Bayer pattern of the image sensor of FIG. 1, according to an example embodiment.

In an embodiment of the image sensor 100 the unit pixel 130 having a Bayer pattern may be replaced with a unit pixel 2430 having a Q cell structure as shown in FIG. 26.

Referring to FIG. 26, in a unit pixel 2430 having a Q cell structure, the R pixel RP1 may be configured to receive red light and/or may be divided into four pixels (e.g., first red pixel 17R1, second red pixel 17R2, third red pixel 17R3, and fourth red pixel 17R4), the first G pixel GP1 may be configured to receive green light and/or may be divided into four pixels (e.g., first green pixel 17G1, second green pixel 17G2, third green pixel 17G3, fourth green pixel 17G4), the second G pixel GP2 may be configured to receive green light and/or may be divided into four pixels (e.g., fifth green pixel 17G5, sixth green pixel 17G6, seventh green pixel 17G7, and eighth green pixel 17G8), and the B pixel BP1 may be configured to receive blue light and/or may be divided into four pixels (e.g., first blue pixel 17B1, second blue pixel 17B2, third blue pixel 17B3, and fourth blue pixel 17B4). In this Q cell structure, the R pixel RP1 may correspond to the R pixel of the Bayer pattern, the first and second G pixels GP1 and GP2 may correspond to two G pixels of the Bayer pattern, and the B pixel BP1 may correspond to the B pixel of the Bayer pattern.

As a result, since the Q cell structure may be and/or include a structure in which each pixel among pixels forming a Bayer pattern is subdivided into 4 pixels, a Bayer pattern of 2×2 pixels may correspond to a Q cell structure of 4×4 pixels.

In the unit pixel 2430 having the Q cell structure, each of the pixels 17R1 to 17R4, 17G1 to 17G8, and 17B1 to 17B4 may include a photoelectric conversion element PD. Accordingly, the unit pixel 2430 of the Q cell structure may include more photoelectric conversion elements than the unit pixel 130 of the Bayer pattern structure. As used herein, a photoelectric conversion element may be referred to as a light detection element and/or a light sensing device.

Figure 27:
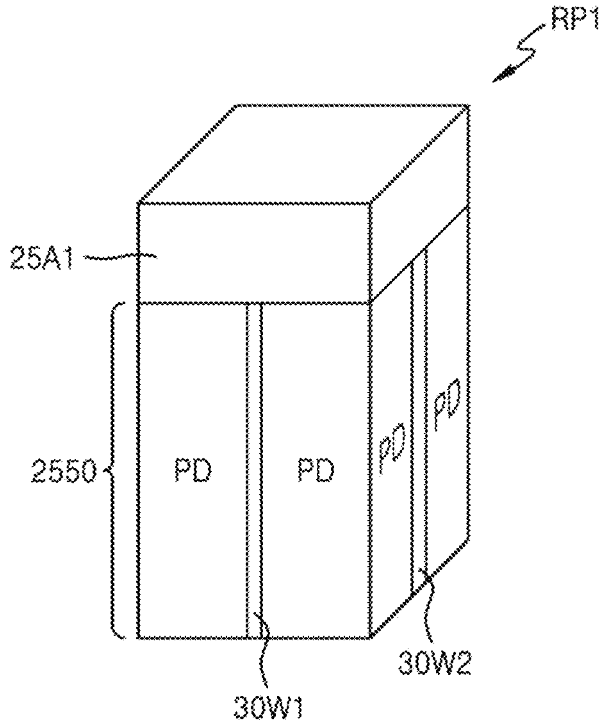
FIG. 27 is a perspective view schematically illustrating a layer structure of an R pixel of a unit pixel having the Q cell structure of FIG. 26, according to an example embodiment.

FIG. 27 shows the 3D layer structure of the R pixel RP1 of the unit pixel 2430 having the Q cell structure. The B pixel BP1 and the first and second G pixels GP1 and GP2 may have a substantially similar and/or the same layer structure as the R pixel RP1. That is, the layer structure of the R pixel RP1 shown in FIG. 27 may be the same layer structure as the layer structures of the B pixel BP1, the first G pixel GP1, and/or the second G pixel GP2.

Referring to FIG. 27, the R pixel RP1 may include a sequentially stacked photoelectric conversion layer 2550 and a first color routing meta-structure layer 25A1. The photoelectric conversion layer 2550 may include four photoelectric conversion elements PD arranged in a 2×2 pattern. Four photoelectric conversion elements PD may be provided to correspond to the first to fourth pixels 17R1 to 17R4 of the R pixel RP1 on a one-to-one basis. The first color routing meta-structure layer 25A1 may include a meta-structure having independent symmetry (e.g., a plurality of meta-patterns and/or nano-patterns aligned to have symmetry). For example, the meta-structure of the first color routing meta-structure layer 25A1 may include the first meta-structure MS1 of FIG. 12 and/or the first meta-structure 10M1 of FIG. 13, but is not limited thereto.

Figure 28:
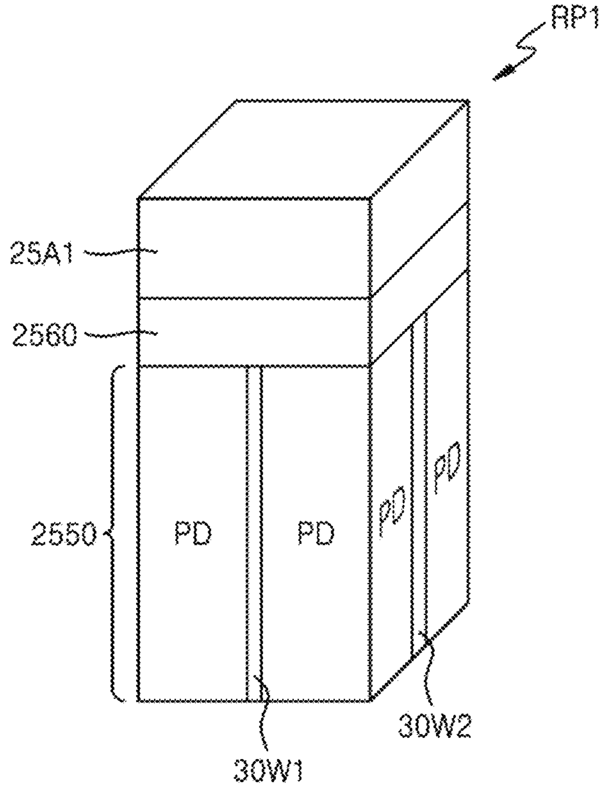
FIG. 28 is a perspective view illustrating a case in which a spacer is provided between a photoelectric conversion layer and the color routing meta-structure layer in FIG. 27, according to an example embodiment.

For example, a spacer 2560 may be provided between the photoelectric conversion layer 2550 and the first color routing meta-structure layer 25A1, as shown in FIG. 28. The functionality and/or material of the spacer 2560 may be substantially similar and/or the same as that of the spacer 160 of FIG. 4.

The meta-structure of the color routing meta-structure layer belonging to the B pixel BP1 may have independent symmetry, but may be different from the meta-structure of the first color routing meta-structure layer 25A1 of the R pixel RP1. The meta-structures of the color routing meta-structure layers belonging to the first and second G pixels GP1 and GP2 may have independent symmetry. Alternatively or additionally, the meta-structure of the first color routing meta-structure layer 25A1 of the R pixel RP1 may be different from the meta-structure of the color routing meta-structure layer of the B pixel BP1.

For example, the meta-structure of the color routing meta-structure layer belonging to the first G pixel GP1 and/or the meta-structure of the color routing meta-structure layer belonging to the second G pixel GP2 may be formed to be symmetrical and/or asymmetrical with respect to each other while having independent symmetry, respectively.

Figure 29:
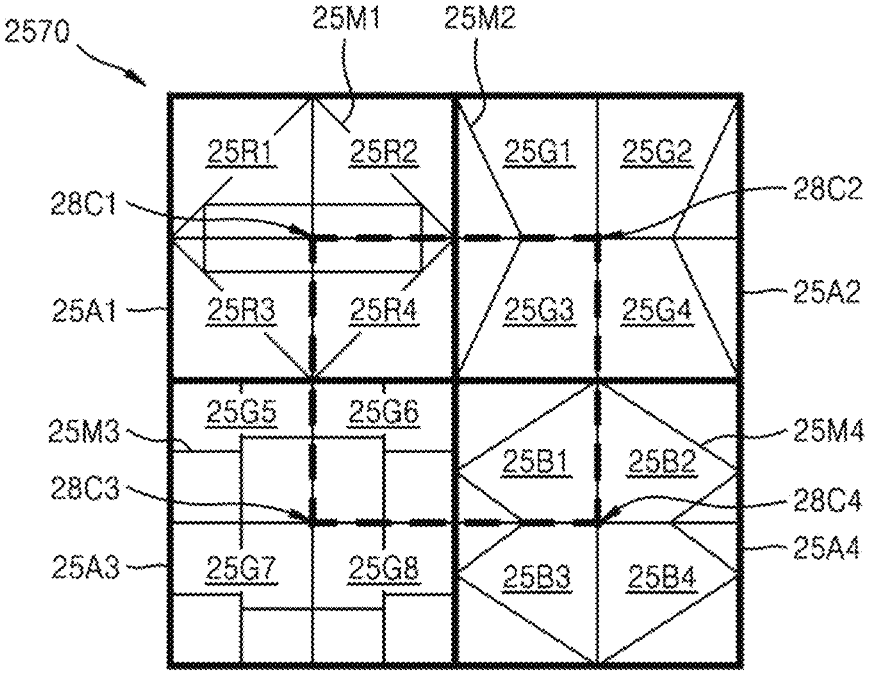
FIG. 29 is a plan view schematically illustrating a color routing meta-structure layer of a unit pixel having the Q cell structure of FIG. 26, according to an example embodiment.

FIG. 29 shows a color routing meta-structure layer 2570 of a unit pixel 2430 having a Q cell structure, according to an embodiment.

Referring to FIG. 29, a color routing meta-structure layer 2570 may include four color routing meta-structure layers (e.g., first color routing meta-structure layer 25A1, second color routing meta-structure layer 25A2, third color routing meta-structure layer 25A3, and fourth color routing meta-structure layer 25A4). The first color routing meta-structure layer 25A1 may correspond to the R pixel RP1, the second color routing meta-structure layer 25A2 may correspond to the first G pixel GP1, the third color routing meta-structure layer 25A3 may correspond to the second G pixel GP2, and the fourth color routing meta-structure layer 25A4 may correspond to the B pixel BP1. In the color routing meta-structure layer 2570, the first to fourth color routing meta-structure layers 25A1 to 25A4 may be disposed in the same plane.

The first color routing meta-structure layer 25A1 includes four areas (e.g., first red area 25R1, second red area 25R2, third red area 25R3, and fourth red area 25R4). The first to fourth areas 25R1 to 25R4 may respectively correspond to the first to fourth pixels 17R1 to 17R4 of the R pixel RP1. The first to fourth areas 25R1 to 25R4 may be and/or include areas in which a plurality of meta-patterns (e.g., nano patterns) forming the first meta-structure 25M1 having independent symmetry may be formed. The first meta-structure 25M1 may be formed over the area of the first color routing meta-structure layer 25A1. The seed meta-structure may be formed in the fourth area 25R4 belonging to the free design area 25CA, which may be an area where the meta-structure is freely designed, may be repeated so that the fourth area 25R4 may be symmetrical up and down and left and right around the horizontal and vertical reference lines passing through the center of symmetry 28C1, thereby the first meta-structure 25M1 having symmetry may be formed. The seed meta-structure of the fourth area 25R4 may be different from the seed meta-structures formed in the other areas (e.g., third green area 25G3, sixth green area 25G6, and first blue area 25B1) of the free design area 25CA. Therefore, the first meta-structure 25M1 may be different from the second to fourth meta-structures 25M2 to 25M4 and/or may be asymmetrical to the second to fourth meta-structures 25M2 to 25M4.

The second color routing meta-structure layer 25A2 may include four areas (e.g., first green area 25G1, second green area 25G2, third green area 25G3, and fourth green area 25G4). The first to fourth areas 25G1 to 25G4 may respectively correspond to the first to fourth pixels 17G1 to 17G4 of the first G pixel GP1. The first to fourth areas 25G1 to 25G4 may be areas in which a plurality of meta-patterns forming the second meta-structure 25M2 having independent symmetry may be formed. The second meta-structure 25M2 may be formed over the area of the second color routing meta-structure layer 25A2. The seed meta-structure formed in the third area 25G3 belonging to the free design area 25CA may be repeated so that the third area 25G3 may be symmetrical up and down and left and right around the horizontal and vertical reference lines passing through the center of symmetry 28C2, thereby the second meta-structure 25M2 may be formed. Accordingly, the second meta-structure 25M2 may have symmetry. Alternatively or additionally, the seed meta-structure formed in the third area 25G3 may be different from the seed meta-structure formed in other areas (e.g., fourth red area 25R4, sixth green area 25G6, and first blue area 25B1) of the free design area 25CA. Therefore, as shown in FIG. 29, the second meta-structure 25M2 may be different from the first, third, and fourth meta-structures 25M1, 25M3, and 25M4, and/or may be asymmetric with the first, third, and fourth meta-structures 25M1, 25M3, and 25M4.

The third color routing meta-structure layer 25A3 may include four areas (e.g., fifth green area 25G5, sixth green area 25G6, seventh green area 25G7, and eighth green area 25G8). The fifth to eighth areas 25G5 to 25G8 may respectively correspond to the fifth to eighth pixels 17G5 to 17G8 of the second G pixel GP2. The fifth to eighth areas 25G5 to 25G8 may be areas in which a plurality of meta-patterns are formed to form a third meta-structure 25M3 having independent symmetry. The third meta-structure 25M3 may include a plurality of meta-patterns arranged in a set form. The third meta-structure 25M3 may be formed over the area of the third color routing meta-structure layer 25A3. The third meta-structure 25M3 may be formed in a substantially similar and/or the same way as the second meta-structure 25M2, and thus may have symmetry. Alternatively or additionally, the seed meta-structure of the third meta-structure 25M3 may be different from other seed meta-structures. Therefore, as shown in FIG. 29, the third meta-structure 25M3 may be different from the first, second, and fourth meta-structures 25M1, 25M2, and 25M4, and/or may be asymmetric with the first, second, and fourth meta-structures 25M1, 25M2, and 25M4.

The fourth color routing meta-structure layer 25A4 may include four areas (e.g., first blue area 25B1, second blue area 25B2, third blue area 25B3, and fourth blue area 25B4). The first to fourth areas 25B1 to 25B4 may respectively correspond to the first to fourth pixels 17B1 to 17B4 of the B pixel BP1. The first to fourth areas 25B1 to 25B4 may be and/or include areas in which a plurality of meta-patterns may be formed so that the fourth meta-structure 25M4 may be formed. The fourth meta-structure 25M4 may include a plurality of meta-patterns arranged in a set form. The fourth meta-structure 25M4 may be formed over the area of the fourth color routing meta-structure layer 25A4. The fourth meta-structure 25M4 may be formed in a substantially similar and/or the same way as the second meta-structure 25M2, and thus may have symmetry. Alternatively or additionally, the seed meta-structure of the fourth meta-structure 25M4 may be different from other seed meta-structures. Therefore, as shown in FIG. 29, the fourth meta-structure 25M4 may be different from the first to third meta-structures 25M1 to 25M3, and/or may be asymmetric with the first to third meta-structures 25M1 to 25M3. The free design area 25CA may include a fourth red area 25R4 of the first color routing meta-structure layer 25A1, a third green area 25G3 of the second color routing meta-structure layer 25A2, a sixth green area 25G6 of the third color routing meta-structure layer 25A3, and a first blue area 25B1 of the fourth color routing meta-structure layer 25A4.

Seed meta-structures of each area 25R4, 25G3, 25G6, and 25B1 of the free design area 25CA may be different from each other as shown in FIG. 29. Therefore, there may be no symmetry between seed meta-structures formed in the free design area 25CA.

For example, the first color routing meta-structure layer 25A1 of the color routing meta-structure layer 2570 corresponds to the R pixel RP1, as shown in FIG. 27, and the center of symmetry 28C1 may correspond to a center where the partition walls 30W1 and 30W2 between the photoelectric conversion elements PD intersect (e.g., the intersection of the partition walls). That is, the intersection of the partition walls 30W1 and 30W2 may be located under the center of symmetry 28C1. The condensation of incident light at the intersection of the partition walls may waste light and may be at least one of cause of a lowering of light efficiency. Therefore, the first meta-structure 25M1 of the first color routing meta-structure layer 25A1 may be designed so that a light spot may be formed at the center of the photoelectric conversion element PD under each of the areas 25R1 to 25R4, and no light spot may be formed at a position corresponding to the center of symmetry 28C1. As a result, it may be possible to prevent a light spot from being formed at the intersection of the partition walls 30W1 and 30W2 located under the center of symmetry 28C1. Alternatively or additionally, the meta-structures 25M2 to 25M4 of the second to fourth color routing meta-structure layers 25A2 to 25A4 may be designed to function in a substantially similar and/or the same manner as described in regard to the first meta-structure 25M1.

The shapes of the first to fourth meta-structures 25M1 to 25M4, shown in FIG. 29, may describe only an example shown to explain that each meta-structure may be formed to have symmetry, and may not limit and/or restrict the form of the meta-structure to that shown.

The color routing meta-structure layer 2570 may be formed as a single layer and/or multiple layers having a three-dimensional structure. When the color routing meta-structure layer 2570 is multi-layered, the color routing meta-structure layer 2570 may have a layered structure as described with reference to FIGS. 14 to 17.

Figure 30:
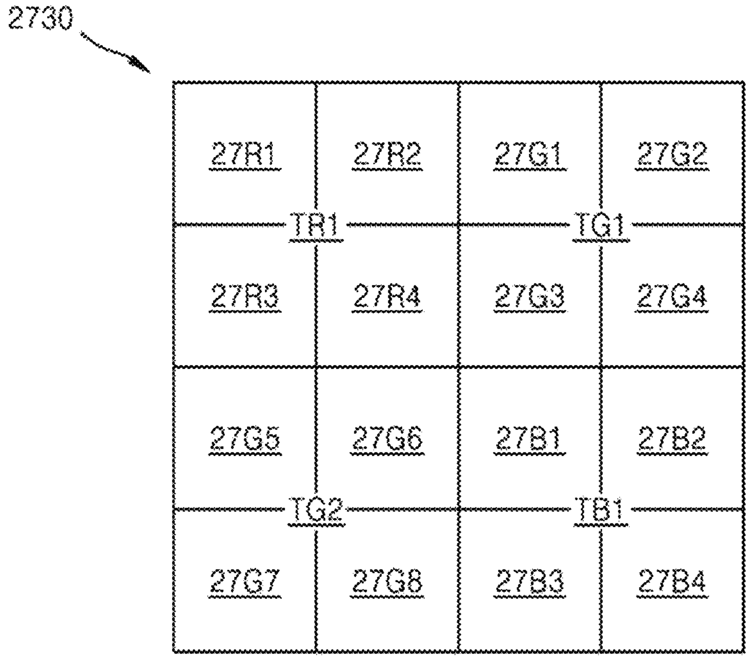
FIG. 30 is a plan view illustrating unit pixels having a tetra cell structure that may replace unit pixels having a Bayer pattern of the image sensor of FIG. 1, according to an example embodiment.

In the image sensor 100, according to an example embodiment, the unit pixel 130 having a Bayer pattern may be replaced with a unit pixel 2730 having a tetra cell structure as shown in FIG. 30.

Referring to FIG. 30, a unit pixel 2730 having a tetra cell structure may include an R pixel TR1 configured to receive red light, first and second G pixels TG1 and TG2 configured to receive green light, and a B pixel TB1 configured to receive blue light. The R pixel TR1 may include the first to fourth pixels 27R1, 27R2, 27R3, and 27R4 arranged in a 2×2 pattern. The first G pixel TG1 may include first to fourth pixels 27G1 to 27G4 arranged in a 2×2 pattern. The second G pixel TG2 may include fifth to eighth pixels 27G5 to 27G8 arranged in a 2×2 pattern. The B pixel TB1 may include first to fourth pixels 27B1 to 27B4 arranged in a 2×2 pattern.

The R pixel TR1 may correspond to the R pixel of the Bayer pattern, the first and second G pixels TG1 and TG2 may correspond to two G pixels of the Bayer pattern, and the B pixel TB1 may correspond to the B pixel of the Bayer pattern.

As a result, the tetra cell structure may be and/or include a structure in which each pixel among the pixels constituting the Bayer pattern may be subdivided into 4 pixels. Accordingly, the Bayer pattern of 2×2 pixels may correspond to a tetra cell structure of 4×4 pixels.

In the unit pixel 2730, each of the pixels 27R1 to 27R4, 27G1 to 27G8, and 27B1 to 27B4 may include a photoelectric conversion element PD. Therefore, the unit pixel 2730 may include more photoelectric conversion elements than the unit pixel 130 having a Bayer pattern structure.

Figure 31:
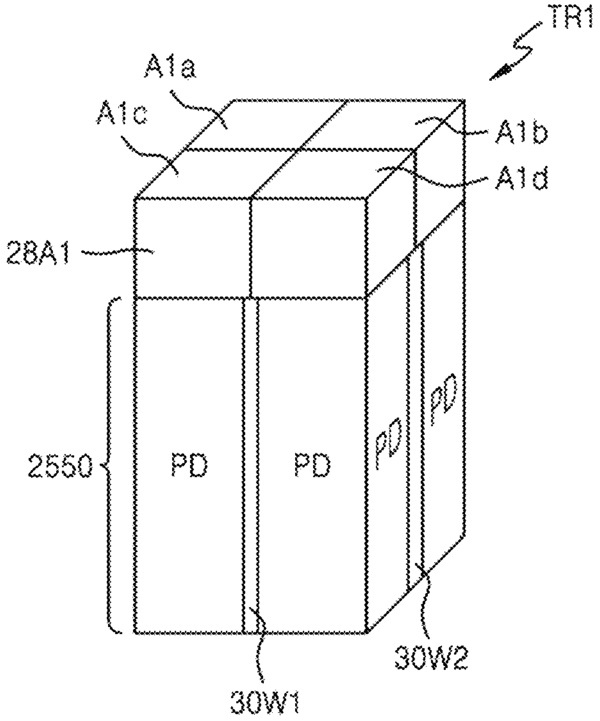
FIG. 31 is a perspective view illustrating an R pixel of the unit pixel of FIG. 30, according to an example embodiment.

FIG. 31 stereoscopically shows the R pixel TR1 of the unit pixel 2730 of FIG. 30. The B pixel TB1 and the G pixels TG1 and TG2 may have a substantially similar and/or the same layer structure as that of the R pixel TR1 shown in FIG. 30. That is, the layer structure of the R pixel TR1 shown in FIG. 31 may be substantially similar and/or be the same layer structure of the B pixel TB1, the first G pixel TG1, and/or the second G pixel TG2.

Referring to FIG. 31, the R pixel TR1 may include a sequentially stacked photoelectric conversion layer 2550 and a first color routing meta-structure layer 28A1. The first color routing meta-structure layer 28A1 may be directly formed on the photoelectric conversion layer 2550.

Four photoelectric conversion elements PD of the photoelectric conversion layer 2550 may be provided to correspond to the first to fourth pixels 27R1 to 27R4 of the R pixel TR1 on a one-to-one basis. The first color routing meta-structure layer 28A1 may include four sub-color routing meta-structure layers A1*a* to A1*d* arranged in a 2×2 pattern on the spacer 2560. The four sub-color routing meta-structure layers A1*a* to A1*d* may not be divided but may be connected horizontally to form one layer. The four sub-color routing meta-structure layers A1*a* to A1*d* may be configured to correspond one-to-one to the four photoelectric conversion elements PD of the photoelectric conversion layer 2550. The four sub-color routing meta-structure layers A1*a* to A1*d* may include different meta-structures from each other. The meta-structure formed in each of the sub-color routing meta-structure layers A1*a* to A1*d* may be designed to focus incident light to a central area of each corresponding photoelectric conversion element PD and to provide autofocus for obliquely incident light.

To this end, the meta-structures of the sub-color routing meta-structure layers A1*a* to A1*d* may be formed to have symmetry.

Figure 32:
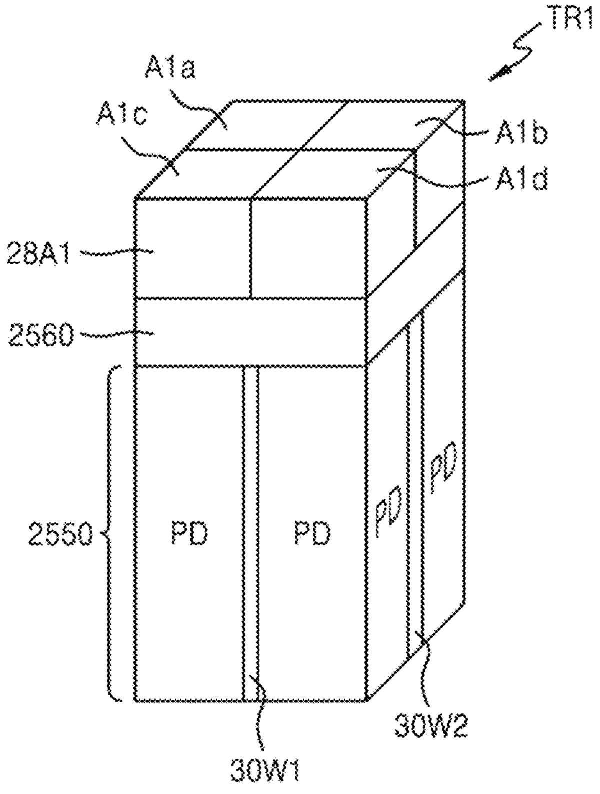
FIG. 32 is a perspective view illustrating a case in which a spacer is provided between a photoelectric conversion layer and the color routing meta-structure layer in FIG. 31, according to an example embodiment

For example, a spacer 2560 may be provided between the photoelectric conversion layer 2550 and the first color routing meta-structure layer 28A1, as shown in FIG. 32.

Figure 33:
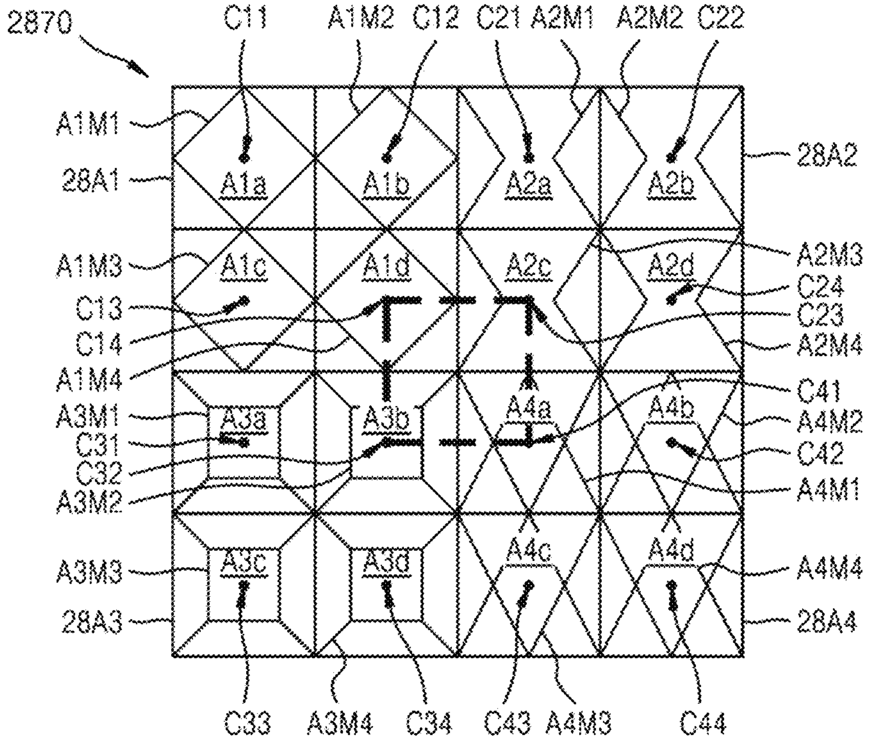
FIG. 33 is a plan view schematically illustrating a color routing meta-structure layer of a unit pixel having the tetra cell structure of FIG. 30, according to an example embodiment.

FIG. 33 shows a color routing meta-structure layer 2870 of a unit pixel 2730 having a tetra cell structure, according to an embodiment.

Referring to FIG. 33, a color routing meta-structure layer 2870 may include color routing meta-structure layers (e.g., first color routing meta-structure layer 28A1, second color routing meta-structure layer 28A2, third color routing meta-structure layer 28A3, and fourth color routing meta-structure layer 28A4). The first color routing meta-structure layer 28A1 may correspond to the R pixel TR1, the second color routing meta-structure layer 28A2 may correspond to the first G pixel TG1, the third color routing meta-structure layer 28A3 may correspond to the second G pixel TG2, and the fourth color routing meta-structure layer 28A4 may correspond to the B pixel TB1.

The first color routing meta-structure layer 28A1 may include four sub-color routing meta-structure layers (e.g., first sub-color routing meta-structure layer A1*a*, second sub-color routing meta-structure layer Alb, third sub-color routing meta-structure layer A1*c*, and fourth sub-color routing meta-structure layer A1*d*). The first to fourth sub-color routing meta-structure layers A1*a* to A1*d* may respectively correspond to the first to fourth pixels 27R1 to 27R4 of the R pixel TR1. Each of the first to fourth sub-color routing meta-structure layers A1*a* to A1*d* may include a meta-structure having symmetry. For example, the first sub-color routing meta-structure layer A1*a* may include a first meta-structure A1M1 having symmetry (e.g., vertical symmetry (up-down symmetry), left-right symmetry, and/or diagonal symmetry). As used herein, symmetry may refer to symmetry based on a horizontal line, a vertical line, and/or a diagonal line passing through the center of symmetry C11. This may also be applied to other meta-structure symmetries.

The second sub-color routing meta-structure layer Alb may include a second meta-structure A1M2 having symmetry. For example, the second meta-structure A1M2 may be the same as and/or different from the first meta-structure A1M1. The third sub-color routing meta-structure layer A1*c* may include a third meta-structure A1M3 having symmetry. The third meta-structure A1M3 may be the same as and/or different from the first and second meta-structures A1M1 and A1M2. The fourth sub-color routing meta-structure layer A1*d* may include a fourth meta-structure A1M4 having symmetry. The fourth meta-structure A1M4 may be the same as and/or different from the first to third meta-structures A1M1 to A1M3. For example, the first to fourth meta-structures A1M1 to A1M4 may be formed to be symmetrical and/or asymmetrical to each other.

The second color routing meta-structure layer 28A2 may include four sub-color routing meta-structure layers (e.g., first sub-color routing meta-structure layer A2*a*, second sub-color routing meta-structure layer A2*b*, third sub-color routing meta-structure layer A2*c*, and fourth sub-color routing meta-structure layer A2*d*). The first to fourth sub-color routing meta-structure layers A2*a* to A2*d* may belong to the first to fourth pixels 27G1 to 27G4 of the first G pixel TG1, respectively. The first sub-color routing meta-structure layer A2*a* may include a first meta-structure A2M1 having symmetry. The second sub-color routing meta-structure layer A2*b* may include a second meta-structure A2M2 having symmetry. For example, the second meta-structure A2M2 may be the same as and/or be different from the first meta-structure A2M1. The third sub-color routing meta-structure layer A2*c* may include a third meta-structure A2M3 having symmetry. The third meta-structure A2M3 may be the same as and/or be different from the first and second meta-structures A2M1 and A2M2. The fourth sub-color routing meta-structure layer A2*d* may include a fourth meta-structure A2M4 having symmetry. The fourth meta-structure A2M4 may be the same as and/or be different from the first to third meta-structures A2M1 to A2M3. For example, the first to fourth meta-structures A2M1 to A2M4 may be formed to be symmetrical or asymmetrical to each other.

The third color routing meta-structure layer 28A3 may include four sub-color routing meta-structure layers (e.g., first sub-color routing meta-structure layer A3*a*, second sub-color routing meta-structure layer A3*b*, third sub-color routing meta-structure layer A3*c*, and fourth sub-color routing meta-structure layer A3*d*). The first to fourth sub-color routing meta-structure layers A3*a* to A3*d* may belong to the fifth to eighth pixels 27G5 to 27G8 of the second G pixel TG2, respectively. The first sub-color routing meta-structure layer A3*a* may include a first meta-structure A3M1 having symmetry. The second sub-color routing meta-structure layer A3*b* may include a second meta-structure A3M2 having symmetry. For example, the second meta-structure A3M2 may be the same as and/or be different from the first meta-structure A3M1. The third sub-color routing meta-structure layer A3*c* may include a third meta-structure A3M3 having symmetry. The third meta-structure A3M3 may be the same as and/or be different from the first and second meta-structures A3M1 and A3M2. The fourth sub-color routing meta-structure layer A3*d* may include a fourth meta-structure A3M4 having symmetry. The fourth meta-structure A3M4 may be the same as and/or be different from the first to third meta-structures A3M1 to A3M3. For example, the first to fourth meta-structures A3M1 to A3M4 may be formed to be symmetrical and/or asymmetrical to each other.

The fourth color routing meta-structure layer 28A4 may include sub-color routing meta-structure layers (e.g., first sub-color routing meta-structure layer A4*a*, second sub-color routing meta-structure layer A4*b*, third sub-color routing meta-structure layer A4*c*, and fourth sub-color routing meta-structure layer A4*d*). The first to fourth sub-color routing meta-structure layers A4*a* to A4*d* may belong to the first to fourth pixels 27B1 to 27B4 of the B pixel TB1, respectively. The first sub-color routing meta-structure layer A4*a* may include a first meta-structure A4M1 having symmetry. The second sub-color routing meta-structure layer A4*b* may include a second meta-structure A4M2 having symmetry. For example, the second meta-structure A4M2 may be the same as and/or be different from the first meta-structure A4M1. The third sub-color routing meta-structure layer A4*c* may include a third meta-structure A4M3 having symmetry. The third meta-structure A4M3 may be the same as and/or be different from the first and second meta-structures A4M1 and A4M2. The fourth sub-color routing meta-structure layer A4*d* may include a fourth meta-structure A4M4 having symmetry. The fourth meta-structure A4M4 may be the same as and/or be different from the first to third meta-structures A4M1 to A4M3. For example, the first to fourth meta-structures A4M1 to A4M4 may be formed to be symmetrical and/or asymmetrical to each other.

Continuing to refer to FIG. 33, free design area 28CA a meta-structure may be freely designed to satisfy an objective function when forming the color routing meta-structure layer 2870. The free design area 28CA may include the fourth quadrant of the fourth sub-color routing meta-structure layer A1*d* of the first color routing meta-structure layer 28A1, the third quadrant of the third sub-color routing meta-structure layer A2*c* of the second color routing meta-structure layer 28A2, the first quadrant of the second sub-color routing meta-structure layer A3*b* of the third color routing meta-structure layer 28A3, and the second quadrant of the first sub-color routing meta-structure layer A4*a* of the fourth color routing meta-structure layer 28A4.

As such, the free design area 28CA may include parts of the four sub-color routing meta-structure layers A1*d*, A2*c*, A3*b*, and A4*a* that are in the central portion of the color routing meta-structure layer 2870, so that the meta-structures formed in the free design area 28CA may not have symmetry with each other.

The free design area 28CA may be set in the form shown in FIGS. 24 and 25.

In the fourth sub-color routing meta-structure layer A1*d* of the first color routing meta-structure layer 28A1, the meta-structure formed in the portion belonging to the free design area 28CA (e.g., the meta-structure formed in the fourth quadrant of the fourth sub-color routing meta-structure layer A1*d*) may be a seed meta-structure. Alternatively or additionally, the fourth meta-structure A1M4 of the fourth sub-color routing meta-structure layer A1*d* may be formed by repeatedly forming the seed meta-structure so as to be vertically symmetrical and left-right symmetrical with respect to the horizontal and vertical reference lines passing through the center of symmetry C14. Accordingly, the fourth meta-structure A1M4 may have symmetry.

The third meta-structure A1M3 may be formed so as to be left-right symmetrical with the fourth meta-structure A1M4, and the second meta-structure A1M2 may be formed so as to be vertically (up-down) symmetrical with the fourth meta-structure A1M4. The first meta-structure A1M1 may be formed so as to be left-right symmetrical with the second meta-structure A1M2, vertically symmetrical with the third meta-structure A1M3, and/or diagonally symmetrical with the fourth meta-structure A1M4.

As a result, the meta-structure formed in each of the first to fourth sub-color routing meta-structure layers A1*a* to A1*d* of the first color routing meta-structure layer 28A1 may originate from the seed meta-structure formed in the part belonging to the free design area 28CA as described above. Accordingly, the meta-structure formed in each of the first to fourth sub-color routing meta-structure layers A1*a* to A1*d* may have symmetry, and symmetry (e.g., left-right symmetry, up-down symmetry, diagonal symmetry) may also occur between the meta-structures of each of the first to fourth sub-color routing meta-structure layer A1*a* to A1*d*. Depending on the shape of the seed meta-structure, the meta-structure formed in each of the first to fourth sub-color routing meta-structure layers A1*a* to A1*d* may have various shapes.

The first to fourth meta-structures A2M1 to A2M4 respectively formed in the first to fourth sub-color routing meta-structure layers A2*a* to A2*d* of the second color routing meta-structure layer 28A2 may be formed by using, as a seed meta-structure, a meta-structure formed in the third quadrant of the third sub-color routing meta-structure layer A2*c* belonging to the free design area 28CA. The formation method may follow the formation method of the first to fourth meta-structures A1M1 to A1M4 of the first color routing meta-structure layer 28A1. Accordingly, each of the first to fourth sub-color routing meta-structure layers A2*a* to A2*d* of the second color routing meta-structure layer 28A2 may have symmetry, and the meta-structures of each of the first to fourth sub-color routing meta-structure layer A2*a* to A2*d* may also have symmetry.

The first to fourth meta-structures A3M1 to A3M4 respectively formed in the first to fourth sub-color routing meta-structure layers A3*a* to A3*d* of the third color routing meta-structure layer 28A3 may be formed by using a meta-structure formed in the first quadrant of the second sub-color routing meta-structure layer A3*b*, which may be a part belonging to the free design area 28CA, as a seed meta-structure. The formation method may follow the formation method of the first to fourth meta-structures A1M1 to A1M4 of the first color routing meta-structure layer 28A1. Therefore, each of the first to fourth sub-color routing meta-structure layer A3*a* to A3*d* of the third color routing meta-structure layer 28A3 may have symmetry, and the meta-structures of each of the first to fourth sub-color routing meta-structure layer A3*a* to A3*d* may also have symmetry.

The first to fourth meta-structures A4M1 to A4M4 respectively formed in the first to fourth sub-color routing meta-structure layers A4*a* to A4*d* of the fourth color routing meta-structure layer 28A4 may be formed by using a meta-structure formed in the second quadrant of the first sub-color routing meta-structure layer A4*a*, which may be a part belonging to the free design area 28CA, as a seed meta-structure. The formation method may follow the formation method of the first to fourth meta-structures A1M1 to A1M4 of the first color routing meta-structure layer 28A1. Accordingly, each of the first to fourth sub-color routing meta-structure layers A4*a* to A4*d* of the fourth color routing meta-structure layer 28A4 may have symmetry, and the meta-structures of each of the first to fourth sub-color routing meta-structure layer A4*a* to A4*d* may also have symmetry.

In FIG. 33, the meta-structures A1M1 to A1M4, A2M1 to A2M4, A3M1 to A3M4, and A4M1 to A4M4 formed in each of the sub-color routing meta-structure layers A1*a* to A1*d*, A2*a* to A2*d*, A3*a* to A3*d*, and A4*a* to A4*d* are shown as geometric figures such as triangles, squares, and rhombuses. However these geometric figures are only examples that are symbolically shown to explain that the meta-structure is formed to have symmetry. The present disclosure is not limited in this regard.

The color routing meta-structure layer 2870 may be formed as a single layer and/or multiple layers having a three-dimensional structure. When the color routing meta-structure layer 2870 is multi-layered, the color routing meta-structure layer 2870 may have a layered structure as described in FIGS. 14 to 17.

The color routing meta-optical element in which the meta-structure exemplified above is formed as a symmetrical structure may also be applied to optical elements that separate and/or receive light according to wavelength, polarization, and the like, such as, but not limited to, multi-spectral devices or polarized image sensors. The color separation and condensation of the color routing meta-structure layer described above may be based on scattering inside the color routing meta-structure layer. Accordingly, the color routing meta-structure layer described above may be regarded as a volumetric metaprism.

Figure 34:
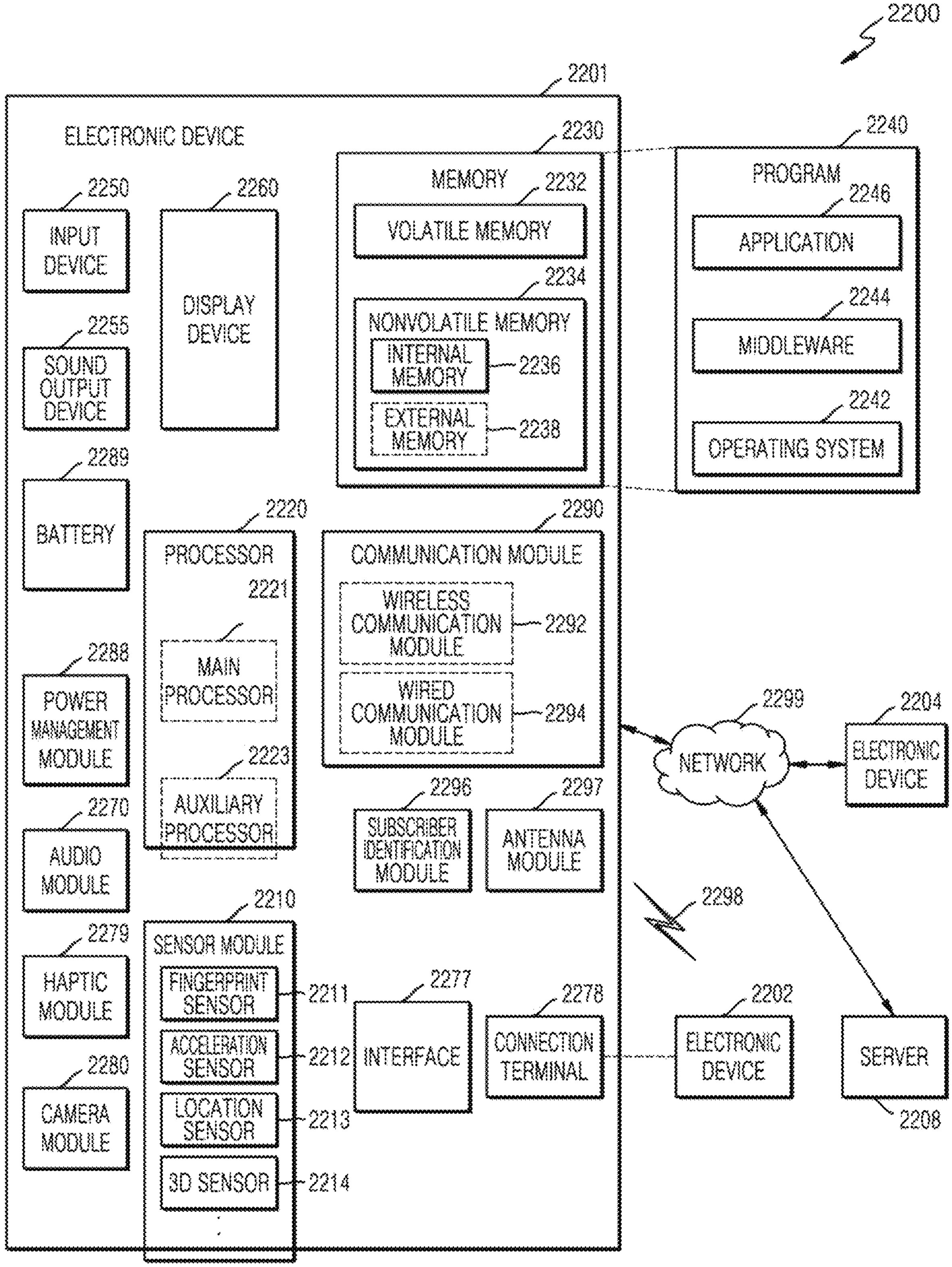
FIG. 34 is a block diagram illustrating an electronic device, according to an example embodiment.

The image sensors including the color routing meta-structure layers according to the above embodiments may be applied to various electronic devices, and FIG. 34 shows an example embodiment thereof.

Referring to FIG. 34, an electronic device 2201 in a network environment 2200 may include several devices and/or modules as shown.

One of the modules, the camera module 2280, may capture still images and moving images. For example, the camera module 2280 may include an imaging system including one of the image sensors shown in FIGS. 2 to 17 and 24 to 33. The camera module 2280 may include a lens assembly including one or more lenses, image sensors, image signal processors, and/or flashes. A window assembly included in the camera module 2280 may collect light emitted from a subject that is an image capture target. The power management module 2288 may manage power supplied to the electronic device 2201. The power management module 2288 may be implemented as a part of a Power Management Integrated Circuit (PMIC).

The battery 2289 may supply power to components of the electronic device 2201. The battery 2289 may include a non-rechargeable primary cell, a rechargeable secondary cell, and/or a fuel cell.

The communication module 2290 may support establishing a direct (e.g., wired) communication channel and/or a wireless communication channel, and performing communication through the established communication channel between the electronic device 2201 and other electronic devices (such as the electronic device 2202, the electronic device 2204, the server 2208, and the like). The communication module 2290 may include one or more communication processors that operate independently of the processor 2220 (such as an application processor) and support direct communication and/or wireless communication. The communication module 2290 may include a wireless communication module 2292 (such as a cellular communication module, a short-range wireless communication module, a Global Navigation Satellite System (GNSS) communication module, and the like) and/or a wired communication module 2294 (such as a local area network (LAN) communication module, a power line communication module, and the like). Among these communication modules, a corresponding communication module may communicate with other electronic devices through a first network 2298 (a short-range communication network such as Bluetooth™, WiFi Direct, or Infrared Data Association (IrDA)) or a second network 2299 (a cellular network, the Internet, or a telecommunication network such as a computer network (such as LAN, WAN, and the like)). These various types of communication modules may be integrated into one component (such as a single chip, and the like), or may be implemented as a plurality of separate components (a plurality of chips). The wireless communication module 2292 may check and authenticate the electronic device 2201 in a communication network such as the first network 2298 and/or the second network 2299 using the subscriber information (such as international mobile subscriber identifier (IMSI), and the like) stored in the subscriber identification module 2296.

The antenna module 2297 may transmit signals and/or power to the outside (such as other electronic devices) or receive signals and/or power from the outside. The antenna may include a radiator made of a conductive pattern formed on a substrate (such as a printed circuit board (PCB), and the like). The antenna module 2297 may include one or a plurality of antennas. If multiple antennas are included, an antenna suitable for a communication method used in a communication network such as the first network 2298 and/or the second network 2299 may be selected from the plurality of antennas by the communication module 2290. Signals and/or power may be transmitted or received between the communication module 2290 and another electronic device through the selected antenna. In addition to the antenna, other components (such as a radio frequency integrated circuit (RFIC)) may be included as part of the antenna module 2297.

Some of the components may connected to each other and/or may exchange signals (such as, commands, data, and the like) through a communication method between peripheral devices (such as a bus, General Purpose Input and Output (GPIO), Serial Peripheral Interface (SPI), Mobile Industry Processor Interface (MIPI), and the like).

The command and/or data may be transmitted or received between the electronic device 2201 and the external electronic device 2204 through the server 2208 connected to the second network 2299. The other electronic devices 2202 and 2204 may be the same as and/or by different types of devices as or from the electronic device 2201. All or some of the operations executed by the electronic device 2201 may be executed by one or more of the other electronic devices 2202, 2204, and 2208. For example, when the electronic device 2201 needs to perform a certain function or service, instead of executing the function or service itself, the electronic device 2201 may request one or more other electronic devices to perform the function or part or all of the service. One or more other electronic devices that receive the request may execute an additional function or service related to the request, and transmit a result of the execution to the electronic device 2201. For example, cloud computing, distributed computing, and/or client-server computing technology may be used.

Figure 35:
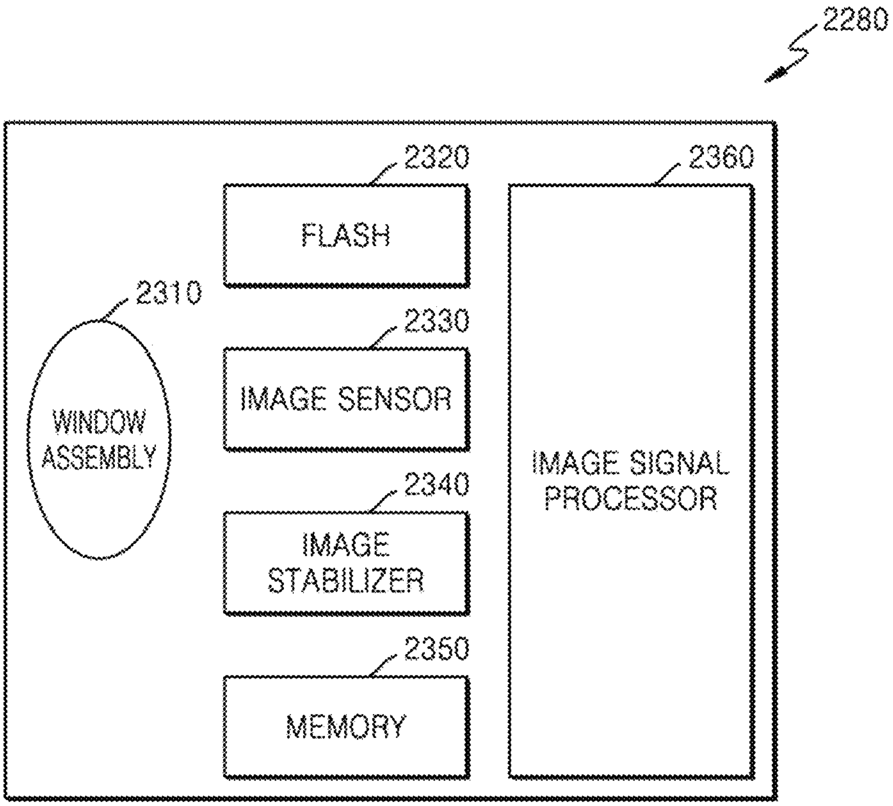
FIG. 35 is a block diagram showing a schematic configuration of a camera module included in the electronic device of FIG. 34, according to an example embodiment.

FIG. 35 is a block diagram showing a schematic configuration of a camera module included in the electronic device of FIG. 34, according to an embodiment.

Referring to FIG. 35, the camera module 2280 may include a window assembly 2310, a flash 2320, an image sensor 2330, an image stabilizer 2340, a memory 2350 (buffer memory, and the like), and/or an image signal processor 2360. The window assembly 2310 may collect light emitted from a subject, which may be an image capturing target, and may include, but not be limited to, a window layer, at least one coded mask layer, a filter layer, and an antireflection film.

The camera module 2280 may include a plurality of window assemblies 2310. For example, the camera module 2280 may be and/or include a dual camera, a 360° camera, a spherical camera, and the like. Some of the plurality of window assemblies 2310 may have the same optical characteristics (e.g., angle of view, focal length, auto focus, F number, optical zoom, and the like) or may have different optical characteristics. The window assembly 2310 may include optical characteristics corresponding to a wide-angle lens and/or a telephoto lens.

The flash 2320 may emit light used to enhance light emitted and/or reflected from an object. The flash 2320 may include one or more light emitting diodes (such as, but not limited to, a red-green-blue (RGB), light-emitting diode (LED), white LED, infrared LED, ultraviolet LED, and the like), and/or a xenon lamp. The image sensor 2330 may acquire an image corresponding to the object by converting light emitted or reflected from the object and transmitted through the window assembly 2310 into an electrical signal. The image sensor 2330 may include one of the image sensors described above with reference to FIGS. 2 to 17 and 24 to 33.

The image stabilizer 2340 may move the window assembly 2310 and/or the image sensor 2330 in a certain direction and/or controls the operating characteristics of the image sensor 2330 (e.g., adjustment of read-out timing, and the like) in response to the movement of the camera module 2280 and/or the electronic device 2301 including the same, such that the negative effects of movement may be compensated for. The image stabilizer 2340 may detect movement of the camera module 2280 and/or the electronic device 2301 using a gyro sensor and/or an acceleration sensor disposed inside and/or outside the camera module 2280. The image stabilizer 2340 may be implemented optically.

The memory 2350 may store at least a portion of data of an image acquired through the image sensor 2330 for a next image processing operation. For example, when a plurality of images is acquired at high speed, the acquired original data (such as, but not limited to, Bayer-Patterned data, high resolution data, and the like) may be stored in the memory 2350, and after displaying only low-resolution images, the memory 2350 may be used to transmit the original data of the selected image (such as user selection) to the image signal processor 2360. The memory 2350 may be integrated into the memory 2230 of the electronic device 2201 and/or may be configured as a separate memory operated independently. Alternatively or additionally, the memory 2350 may include a reconstruction algorithm for an image reconstruction task to be performed by the image signal processor 2360.

The image signal processor 2360 may perform one or more image processing functions on an image acquired through the image sensor 2330 and/or image data stored in the memory 2350. The one or more image processing functions may include, but not be limited to, depth map generation, 3D modeling, panorama generation, feature point extraction, image synthesis, image reconstruction, and/or image compensation (e.g., noise reduction, resolution adjustment, brightness adjustment, blurring, sharpening, softening, and the like). The image signal processor 2360 may perform control (e.g., such as exposure time control, read-out timing control, and the like) of components (such as the image sensor 2330) included in the camera module 2280. The image processed by the image signal processor 2360 may be stored again in the memory 2350 for further processing and/or may be provided to an external component of the camera module 2280 (such as the memory 2230, the display device 2260, the electronic device 2202, the electronic device 2204, the server 2208, and the like). The image signal processor 2360 may be integrated into the processor 2220 or may be configured as a separate processor operated independently from the processor 2220. When the image signal processor 2360 is configured as a processor separate from the processor 2220, the image processed by the image signal processor 2360 may be displayed through the display device 2260 after additional image processing by the processor 2220.

The electronic device 2201 may include a plurality of camera modules 2280 each having different properties or functions. For example, at least one of the plurality of camera modules 2280 may be and/or include a wide-angle camera and/or a telephoto camera. Similarly, at least one of the plurality of camera modules 2280 may be and/or include a front camera and/or a rear camera.

While the present disclosure has been particularly shown and described with reference to embodiments thereof, it will be understood that various changes in form and details may be made therein without departing from the spirit and scope of the following claims.

What is claimed is:

1. An image sensor, comprising:
a plurality of pixels, each pixel of the plurality of pixels comprising:
a photoelectric conversion layer comprising at least one photoelectric conversion element; and
a color routing meta-structure layer provided at a position facing the photoelectric conversion layer, the color routing meta-structure layer comprising:
a meta-structure having a symmetrical structure with respect to a center of a corresponding pixel; and
a multi-layer structure having a refractive index that varies in a direction perpendicular to a light-incident surface,
wherein the multi-layer structure comprises a plurality of layers that are sequentially stacked,
wherein each layer of the plurality of layers comprises a symmetrically formed meta-structure, and
wherein meta-structures of two adjacent layers of the plurality of layers are different from each other.

2. The image sensor of claim 1, wherein the photoelectric conversion layer comprises one photoelectric conversion element.

3. The image sensor of claim 1, wherein:
each pixel of the plurality of pixels comprises at least one of a red (R) pixel, a green (G) pixel, and a blue (B) pixel, and
the photoelectric conversion layer comprises four photoelectric conversion elements arranged in a 2×2 pattern.

4. The image sensor of claim 3, wherein:
the color routing meta-structure layer comprises four sub-color routing meta-structure layers corresponding to the four photoelectric conversion elements, and
each layer of the four sub-color routing meta-structure layers comprises a meta-structure comprising a distinct symmetrical structure.

5. The image sensor of claim 1, wherein:
each layer of the multi-layer structure comprises a distinct meta-structure comprising a distinct symmetrical structure.

6. The image sensor of claim 1, wherein:
the color routing meta-structure layer comprises a plurality of color routing meta-structure layers that are sequentially stacked,
a first color routing meta-structure layer of the plurality of color routing meta-structure layers comprises a first meta-structure formed as a first symmetrical structure,
a second color routing meta-structure layer of the plurality of color routing meta-structure layers comprises a second meta-structure formed as a second symmetrical structure,
a third color routing meta-structure layer of the plurality of color routing meta-structure layers comprises a third meta-structure formed as a third symmetrical structure,
a fourth color routing meta-structure layer of the plurality of color routing meta-structure layers comprises a fourth meta-structure formed as a fourth symmetrical structure,
a fifth color routing meta-structure layer of the plurality of color routing meta-structure layers comprises a fifth meta-structure formed as a fifth symmetrical structure, and
a first shape of the first meta-structure, a second shape of the second meta-structure, a third shape of the third meta-structure, a fourth shape of the fourth meta-structure, and a fifth shape of the fifth meta-structure are different from each other.

7. The image sensor of claim 1, wherein:
the plurality of pixels comprises an R pixel configured to receive red light, a first G pixel configured to receive green light, a second G pixel configured to receive green light, and a B pixel configured to receive blue light, and
a first meta-structure comprised by a first color routing meta-structure layer of the R pixel, a second meta-structure comprised by a second color routing meta-structure layer of the first G pixel, a third meta-structure comprised by a third color routing meta-structure layer of the second G pixel, and a fourth meta-structure comprised by a fourth color routing meta-structure layer of the B pixel are different from each other.

8. The image sensor of claim 7, wherein:
the R pixel, the first G pixel, the second G pixel, and the B pixel are aligned to form a Bayer pattern, and
the second meta-structure and the third meta-structure comprise mutually symmetric meta-structures.

9. The image sensor of claim 7, wherein:
the R pixel, the first G pixel, the second G pixel and the B pixel are aligned to form a Bayer pattern, and
the second meta-structure and the third meta-structure are different from each other.

10. The image sensor of claim 1, further comprising:
a spacer provided between the photoelectric conversion layer and the color routing meta-structure layer.

11. A meta-optical element, comprising:
an area corresponding to a pixel of an image sensor,
wherein the area comprises a multi-layer structure having a refractive index that varies in a direction perpendicular to a light-incident surface,
wherein the area further comprises a meta-structure formed as a symmetrical structure,
wherein the multi-layer structure comprises a plurality of layers that are sequentially stacked,
wherein each layer of the plurality of layers comprises a symmetrically formed meta-structure, and
wherein meta-structures of two adjacent layers of the plurality of layers are different from each other.

12. The meta-optical element of claim 11, wherein:
the image sensor comprises:
a red (R) pixel configured to receive red light;
a first green (G) pixel configured to receive green light;
a second green (G) pixel configured to receive green light; and
a blue (B) pixel configured to receive blue light,
the area comprises:
a first area corresponding to the R pixel and comprising a first meta-structure formed as a first symmetrical structure;
a second area corresponding to the first G pixel and comprising a second meta-structure formed as a second symmetrical structure;
a third area corresponding to the second G pixel and comprising a third meta-structure formed as a third symmetrical structure;
a fourth area corresponding to the B pixel and comprising a fourth meta-structure formed as a fourth symmetrical structure, and
the first meta-structure, the second meta-structure, the third meta-structure, and the fourth meta-structure are different from each other.

13. The meta-optical element of claim 12, wherein:
the R pixel, the first G pixel, the second G pixel, and one B pixel are aligned to form a Bayer pattern, and
the second meta-structure and the third meta-structure are symmetric to each other.

14. The meta-optical element of claim 12, wherein:
the R pixel, the first G pixel, the second G pixel, and the B pixel are aligned to form a Bayer pattern, and
the second meta-structure and the third meta-structure are different from each other.

15. The meta-optical element of claim 11, wherein:
the pixel comprises at least one of a red (R) pixel, a green (G) pixel, and a blue (B) pixel,
the pixel comprises four photoelectric conversion elements,
the area comprises four areas corresponding to the four photoelectric conversion elements, and
each area of the four areas comprises a symmetrically formed meta-structure.

16. The meta-optical element of claim 11, wherein:
the pixel comprises at least one of a red (R) pixel, a green (G) pixel, and a blue (B) pixel, and
the pixel comprises four photoelectric conversion elements.

17. An electronic device, comprising:
at least one image sensor comprising:
a plurality of pixels, each pixel of the plurality of pixels comprising:
a photoelectric conversion layer comprising at least one photoelectric conversion element; and
a color routing meta-structure layer provided at a position facing the photoelectric conversion layer, the color routing meta-structure layer comprising:
a meta-structure having a symmetrical structure with respect to a center of a corresponding pixel; and
a multi-layer structure having a refractive index that varies in a direction perpendicular to a light-incident surface;
a processor configured to control the at least one image sensor to capture an image; and a display configured to display information that is acquired from the image, wherein the multi-layer structure comprises a plurality of layers that are sequentially stacked, wherein each layer of the plurality of layers comprises a symmetrically formed meta-structure, and wherein meta-structures of two adjacent layers of the plurality of layers are different from each other.

18. An image sensor, comprising:

a pixel layer that comprises a red pixel, a blue pixel, two green pixels that are arranged in a two-by-two matrix form; and a color routing meta-structure layer that comprises:

symmetrical meta-structures which are provided directly above the two green pixels and are arranged in a diagonal direction; and meta-structures that have random and asymmetrical structures from each other, and are provided in a remaining area of the color routing meta-structure layer, wherein the color routing meta-structure layer comprises a multi-layer structure having a refractive index that varies in a direction perpendicular to a light-incident surface.

* * * * *